United States Patent [19]

Sudoh et al.

[11] Patent Number: 4,916,403

[45] Date of Patent: Apr. 10, 1990

[54] DIGITAL PHASE-LOCKED LOOP SYSTEM

[75] Inventors: Kengo Sudoh; Hiroshi Ii; Hiroyuki Matsuoka, all of Higashi hiroshima, Japan

[73] Assignee: Sharp Kabushiki Kaisha, Osaka, Japan

[21] Appl. No.: 251,402

[22] Filed: Sep. 30, 1988

[30] Foreign Application Priority Data

| | | | |
|---|---|---|---|
| Oct. 1, 1987 | [JP] | Japan | 62-248725 |
| Nov. 7, 1987 | [JP] | Japan | 62-281501 |
| Nov. 7, 1987 | [JP] | Japan | 62-281502 |
| Dec. 2, 1987 | [JP] | Japan | 62-306224 |
| Dec. 24, 1987 | [JP] | Japan | 62-328949 |

[51] Int. Cl.[4] ..... H03L 7/00

[52] U.S. Cl. ..... 328/155; 331/1 A; 328/133

[58] Field of Search ..... 328/133, 134, 155; 307/511; 331/1 A

[56] References Cited

U.S. PATENT DOCUMENTS

| | | | |
|---|---|---|---|
| 4,105,979 | 8/1978 | Kage | 328/134 |
| 4,151,473 | 4/1979 | Coleman et al. | 328/134 |
| 4,634,998 | 1/1987 | Crawford | 331/1 A |
| 4,688,094 | 8/1987 | Tanabe et al. | 328/155 |
| 4,763,342 | 8/1988 | Ambrosio et al. | 328/155 |

*Primary Examiner*—John S. Heyman
*Attorney, Agent, or Firm*—Birch, Stewart, Kolasch & Birch

[57] ABSTRACT

A digital phase-locked loop system having an oscillator which generates a clock signal of a stationary frequency, a frequency divider which frequency-divides the clock signal to produce a phase-locked loop clock signal, a phase difference detector which detects a phase difference between an input signal and the phase-locked loop clock signal and outputs a phase difference detection signal, and a frequency dividing rate setting device to set a frequency dividing rate corresponding to the phase difference in response to the phase difference detection signal and apply the rate to the frequency divider. The phase difference detector includes a first counter to detect a phase difference at a leading edge of the clock signal from the oscillator and a second counter to detect it at a trailing edge of the clock signal. The frequency dividing rate setting device includes an adder to add the phase differences detected by the first and second counters, a latch to hold an addition result produced by the adder, and a decoder to decode the frequency dividing rate corresponding to the addition result held by the latch. The frequency divider frequency-divides the clock signal according to the frequency dividing rate decoded by the decoder and newly generates a phase-locked loop clock signal.

4 Claims, 22 Drawing Sheets

DIGITAL PHASE-LOCKED LOOP SYSTEM

BACKGROUND OF THE INVENTION

This invention relates to a digital phase-locked loop system in which a phase-locked loop (PLL) constructed with digital circuit elements.

Many types of digital phase-locked loop systems have been recently disclosed. These digital phase-locked loop systems have a phase-locked loop composed of digital circuit elements. In comparison with analog type systems, such digital type systems have advantages for example, that scatter due to parts used is insignificant and that desired characteristics can be obtained without the necessity of adjustment. On the other hand one problem, in digital phase-locked loop systems is that, an output from a stationary oscillator is frequency-divided and outputted as an output from the loop, and therefore the phase-locked loop can be operated only by input frequencies in the range below one several-tenth of a maximum frequency for operating a logical circuit element incorporated therein.

Furthermore another problem is that, if the input frequency is increased, a frequency-dividing rate becomes smaller, resulting in rougher quantization and worse loop characteristics. Especially in digital phase-locked loop systems utilizing input frequencies in the range of a fraction of a highest operating frequency of the logical circuit element, influence of characteristics of the logical circuit element itself, especially influence of delay characteristic, is significant as well as the influence of the quantization error and thus, adoption of a complicated circuit composition is difficult.

FIG. 21 shows an example of a traditional phase-locked loop system for the input of a fraction (1/N, N: a positive integer) of a frequency of a traditional stationary oscillator (OSC) 4. Phase difference between input signal PBSG and phase-locked loop clock signal PLLCK is detected as counted value of a counter 1.

Clock pulse MCK which is an output of the stationary oscillator 4 is shown in FIG. 22 (1), input signal PBSG in FIG. 22 (2), and phase-locked loop clock signal PLLCK in FIG. 22 (3). Signal $\overline{Q}$A from an output terminal $\overline{Q}$ of the D-type flip-flop 3 is shown in FIG. 22 (4). Clock pulse MCK, input signal PBSG, and output signal $\overline{Q}$A of a D-type flip-flop 3 are applied to an AND gate G1 and an output of the AND gate G1 is supplied to a clock input terminal CK of the counter 1. Output signal CNTOUT of the counter 1 is shown in FIG. 22 (5).

Output signal U of a frequency divider 7 is applied to a clock input terminal CK of a D-type flip-flop 8 and is also applied to the clock input terminal CK of the D-type flip-flop 3 through an inversion circuit N1 and then drawn out as phase-locked loop clock signal PLLCK.

Output of an AND gate G2 is applied to the counter 1 and register 5 as reset signal RESET. The reset signal RESET is as shown in FIG. 22 (6). In FIG. 22, there exists a phase difference in the time interval between a step-up edge "a" of the input signal PBSG and a step-up edge "b" of the phase-locked loop clock signal PLLCK and this time interval is counted by the counter 1.

The input signal PBSG, output signal $\overline{Q}$A from the D-type flip-flop 3 which latches the input signal PBSG at the step-up or leading edge of the phase-locked loop clock signal PLLCK, and clock pulses MCK from the stationary oscillator 4 are applied to the AND gate G1 before the clock input into the counter 1, by which the counter 1 provided with the output of the AND gate 1 counts the time between the edges a–b. The counter 1 counts the pulses from the AND gate G1 until reset signal RESET from the other AND gate G2 is inputted.

Output from a terminal Q of the D type flip-flop 8 which latches the output from a terminal Q of the D type flip-flop 3 at the step-up edge of the signal U and the output from the terminal Q of the D type flip-flop 3 are applied to the AND gate G2 and the signal CNTOUT which represents the counted value of the counter 1 is latched by the register 5 at the step-up edge of the reset signal RESET from the AND gate G2.

Then the counter 1 is reset in response to the reset signal RESET and set at the step-up edge the next input signal PBSG, and the next counting operation is started. Phase difference signal I outputted from the register 5 is shown in FIG. 22 (7), which is applied to a decoder 6 and decoded. Load signal E outputted by the decoder 6 is as shown in FIG. 22 (8), which signal is loaded in the frequency divider 7 as a frequency dividing rate for the frequency divider 7.

In this way, the clock pulse MCK from the stationary oscillating circuit 4 is frequency-divided by a value represented by the phase difference signal I indicative of the difference between the input signal APBSG and phase-locked loop clock signal PLLCK, and then a frequency dividing rate of the frequency divider 7 generating the phase-locked loop clock signal APLLCK is changed to another one, so that phases of the input signal PBSG and phase-locked loop clock signal PLLCK are kept so as to agree with each other.

The frequency dividing rate of the frequency divider 7 is N when the phases of the input signal PBSG and phase-locked loop clock signal PLLCK agree, and the rate becomes N+1 or N−1 depending on the degree of the phase difference so that the phases agree with each other. For instance, the decoder 6 at N=8 functions to decode to load signal E for the frequency divider 7 to obtain the frequency dividing rate of the frequency divider 7 corresponding to the phase difference signal I.

The frequency divider 7 is loaded with the load signal E representing the frequency dividing rate applied from the decoder 6 in response to load clock signal F. This load clock signal F is generated as shown in FIG. 22 (9) by the logical circuit 9 when the output signal U of the frequency divider 7 represents a specified value. In FIG. 22, where N=8, and since phase difference exists between the time points a and b, load signal E representing frequency division into 9 is applied to the frequency divider 7 from the decoder 6 at the time point c, and the phase difference is corrected to zero at the time point d.

According to the prior art as shown in FIGS. 21 and 22, when the input signal APBSG has a constant cycle as shown in FIG. 22, a normal operation is possible. However, when the input signal PBSG has a modulated waveform as shown in FIG. 23 (1), the cycle of the input signal PBSG changes to longer or shorter one. The phase-locked loop clock signal PLLCK at this time is shown in FIG. 23 (2). When phase difference is caused to it, it may be corrected by the length of the cycle of the input signal PBSG.

FIG. 23 (3) shows the output signal $\overline{Q}$A of the D type flip-flop 3, FIG. 23 (4) shows the output signal CNTOUT of the counter 1, FIG. 23 (5) shows the reset signal RESET, FIG. 23 (6) shows the phase difference signal I outputted by the register 5, FIG. 23 (7) shows the load signal E representing a frequency dividing rate of the decoder 6, and FIG. 23 (8) shows the load clock signal F from the logical circuit 9. In FIG. 23, the phase difference at the point of time al is corrected at the points of time b1, c1, and d1 in the same way and therefore the phase becomes reversed in polarity at the point of time b1 which gives adverse influence on the phase-locked loop characteristics.

SUMMARY OF THE INVENTION

One object of this invention is to provide a digital phase-locked loop system to correct frequency dividing rate of a frequency divider properly even when cycle of an input signal changes so that phase of phase-locked loop clock signal agrees with that of the input signal.

In order to accomplish the above object, the digital phase-locked loop system according to this invention contains an oscillator which generates a clock signal of a stationary frequency. A frequency divider is provided, to frequency-divide the clock signal generated by the oscillator and produce a phase-locked loop clock signal. There is phase difference detecting means to detect phase difference between an input signal and the phase-locked loop clock signal and output a phase difference detection signal. A frequency dividing rate setting means is used to set a frequency dividing rate corresponding to the phase difference in response to the phase difference detection signal and supply the frequency dividing rate to the frequency divider. A frequency division constant setting means is used to supply a predetermined frequency dividing rate to the frequency divider; and frequency dividing rate switching means is used to supply the frequency divider with an output from the frequency dividing rate setting means in response to the phase difference detecting signal when the phase difference is detected and then supply the frequency divider with an output from the frequency dividing constant setting means.

The digital phase-locked loop system constructed as described above functions as follows: it sets a frequency dividing rate by the output from the frequency dividing rate setting means when phase difference occurs, corrects this frequency dividing rate once or more by the predetermined number of times, and thereafter gives a predetermined frequency division constant from the frequency division constant setting means, such as a frequency division rate at normal time, to the frequency divider so that the frequency dividing rate is not corrected. This enables the system to minimize the deviation of phases between the input signal and phase-locked loop clock signal.

Another object of this invention is to provide a digital phase-locked loop system which can be operated with favorable characteristics avoiding deviation between input signal and phase-locked loop clock signal even by wide frequency changes of input signals and can be constructed simply.

In order to accomplish the above object, the digital phase-locked loop system according to this invention includes an oscillator which generates a clock signal of a stationary frequency. A frequency divider to frequency-divide the clock signal generated by the oscillator is used to produce a phase-locked loop clock signal. A phase difference detecting means to detect the phase difference between an input signal and the phase-locked loop clock signal and output a phase difference detection signal. A frequency dividing rate setting means is used to set a frequency dividing rate corresponding to the phase difference in response to the phase difference detection signal and to apply the frequency dividing rate to the frequency divider. A frequency dividing rate adjusting means to detect frequency components of the input signal in response to the output of the oscillator and set such a frequency dividing rate so that the phases of the input signal and phase locked loop clock signal coincide with each other. Also a frequency dividing rate switching means is used to apply the output from the frequency dividing rate setting means to the frequency divider in response to the phase difference detection signal at the time of detection of the phase difference, and then apply the output from the frequency dividing adjusting means to the frequency divider.

According to the composition construction of a circuit as described above, a frequency dividing rate corresponding to a phase difference between an input signal and phase-locked loop clock signal is set by the frequency dividing rate setting means and the frequency divider is operated according to it. Such a frequency dividing rate setting means can count a time interval between a leading edge of the input signal and a leading edge of the phase-locked loop clock signal, for instance, and set the frequency dividing rate.

The frequency dividing rate adjusting means detects changes in the minimum repetitive frequency of the input signal PBSG by shifting with the clock signal from the oscillator, for instance, and determines the frequency dividing rate based on the frequency components of this input signal. The frequency dividing rate switching means first operates the frequency divider in accordance with the frequency dividing rate which is set by the frequency dividing rate setting means when a phase difference is detected, and then operates the same at the frequency dividing rate which is set by the frequency dividing rate adjusting means.

According to the above structure a simple structure can handle wide changes in frequencies of input signals with favorable characteristics without significant deviation in phase between the input signals and phase-locked loop clock signals, and can prevent unlocking of the phase-locked loop.

Still another object of this invention is to make it possible with a simple circuit structure to coincide phases of at least two types of input signals reproduced in different speed modes and phase-locked loop clock.

In order to accomplish the above object, the digital phase-locked loop system according to this invention includes an oscillator which generates a clock signal of a stationary frequency. A frequency divider is provided to frequency-divide the clock signal generated by the oscillator and produce a phase- locked loop clock signal. A phase difference detecting means is produced to detect phase difference between an input signal and the phase-locked loop clock signal and output a phase difference detection signal. Another frequency dividing rate is provided setting means which includes at least two types of decoders with different decode characteristics to the magnitude of the phase difference detection signal to set a frequency dividing rate corresponding to the phase difference in response to the phase difference detection signal and supply the frequency divider with the frequency dividing rate; and means to select either one of the two types of decoders according to a speed mode of the input signal; wherein, in response to the phase difference detection signal, the frequency divider frequency-divides the clock signal at a specified frequency dividing rate set in accordance with the output of the selected decoder and generates the phase-locked loop clock signal.

With the structure as described above, when a phase difference detection signal is detected, the phase difference detection signal is decoded by one of the at least two decoders and loaded as a frequency dividing rate value of the frequency divider which generates the phase-locked loop clock. Here the decoder being used is switched to the other having different decoding characteristics by the speed mode of the input signal. For instance, at DAT, such a decoder is selected that makes much correction of the frequency dividing rate when phase deviation amount is large and little correction of it when the phase deviation amount is small in normal mode for usual reproduction, and a decoder to correct the frequency dividing rate approximately in proportion to the phase deviation amount is selected in search mode due to large fluctuation of speed.

Still another object of this invention is to provide a digital phase-locked loop system which can make the frequency of a basic clock lower and follow changes in frequency of the input signal satisfactorily.

In order to accomplish the above object, the digital phase-locked loop system according to this invention includes an oscillator which generates a clock signal of a stationary frequency. A frequency divider is used to frequency-divide the clock signal generated by the oscillator and produce a phase-locked loop clock signal. A phase difference detecting means is used to detect phase difference between an input signal and the phase-locked loop clock signal and output a phase difference detection signal; and frequency dividing rate setting means to set a frequency dividing rate corresponding to the phase difference in response to the phase difference detecting signal and apply the frequency dividing rate to the frequency divider; wherein the phase difference detecting means includes a first counter to detect the phase difference at a leading edge of the clock signal from the oscillator and a second counter to detect the phase difference at a trailing edge of the clock signal, the frequency dividing rate setting means includes an adder to add the phase difference detected by the first counter and the phase difference detected by the second counter, a latch to hold an addition result produced by the adder, and a decoder to decode the frequency dividing rate corresponding to the addition result held by the latch, and the frequency divider frequency-divides the clock signal according to the frequency dividing rate decoded by tee decoder and newly generates a phase locked loop clock signal.

The digital phase-locked loop system with the structure as described above functions as follows:

The first counter detects the phase difference between an input data and phase-locked loop clock at a leading edge of the clock signal, while the second counter detects the phase difference at a trailing edge of the clock. The adder adds the phase difference detected by the first counter and that detected by the second counter, and the latch holds the addition result. Then the decoder decodes a frequency dividing rate according to the addition result, and the frequency divider frequency-divides the clock according to the frequency dividing rate decoded as described above and newly generates a phase-locked loop clock.

Since the phase difference is detected at the leading or step-up edge and trailing or step-down edge of the clock respectively, detection of the phase difference can be effected using a clock signal of low frequency. Furthermore, since the phase-locked loop clock is generated at a frequency dividing rate according to the phase difference, changes in input signal frequency are satisfactorily followed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

First embodiment

A first embodiment of this invention will be described below referring to FIGS. 1 and 2.

Figure 1:
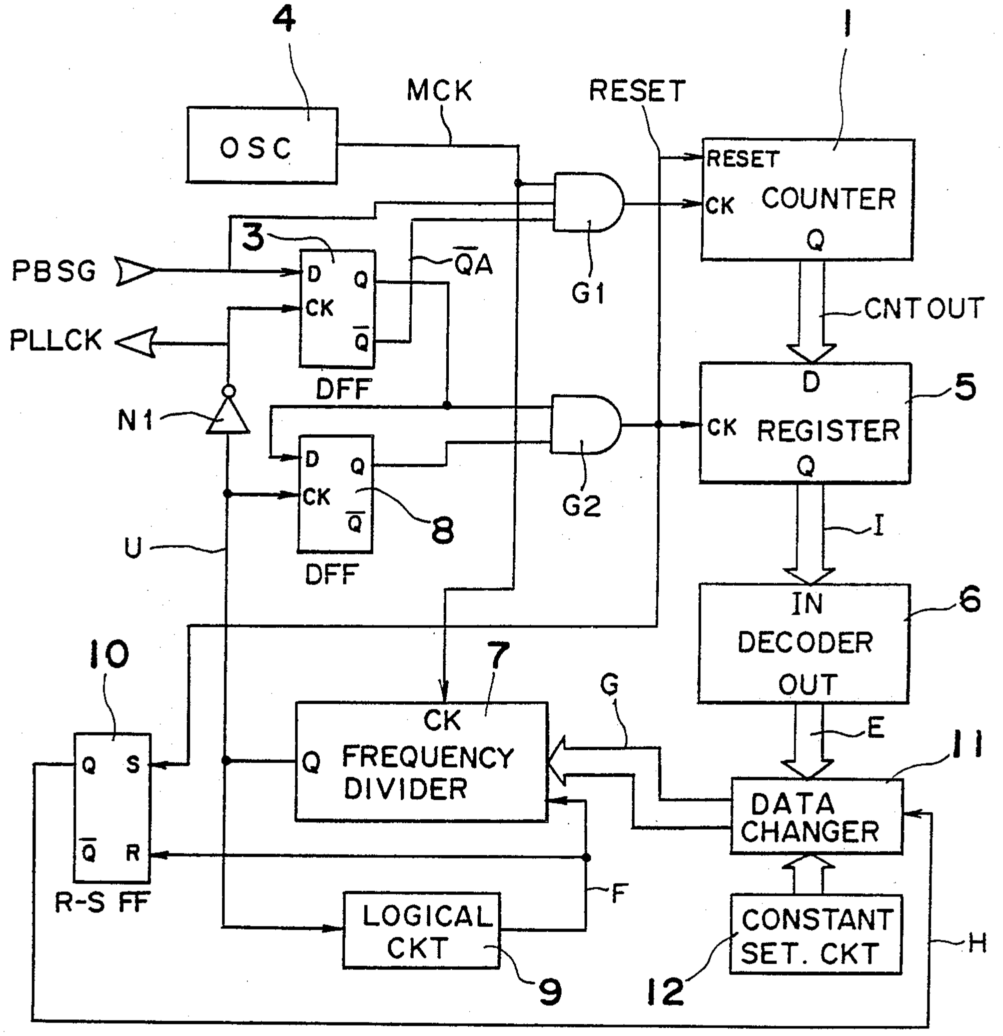
FIG. 1 is a block diagram of a first embodiment of this invention.

FIG. 1 is a block diagram of this embodiment.

Figure 2:
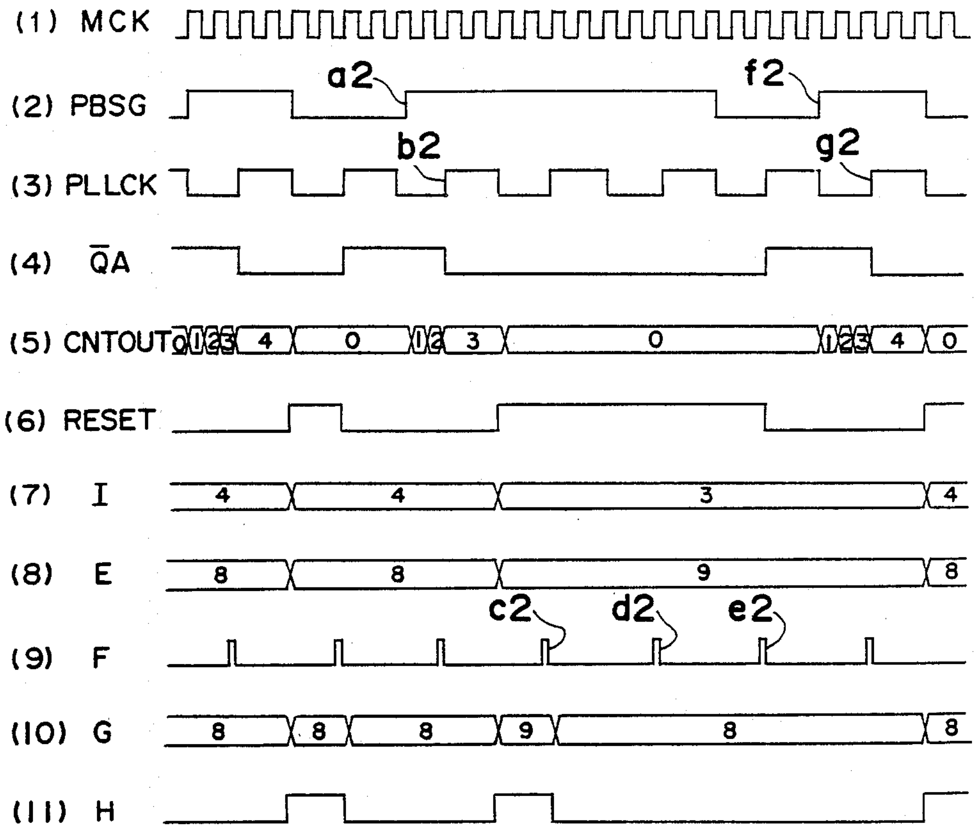
FIG. 2 is a waveform diagram to explain the operation of the embodiment as shown in FIG. 1.

In the figure, clock pulse MCK from the stationary oscillator 4 is generated as shown in FIG. 2 (1) and input to the AND gate G1. Input signal PBSG has a waveform as shown in FIG. 2 (2), is applied to the input terminal D of the D type flip-flop 3 as well as to the AND gate G1. The D type flip-flop 3 draws the logical value which was applied to the input terminal D when phase-locked loop clock signal PLLCK was input to the clock input terminal CK to the output terminal Q and signal $\overline{Q}A$ is output from the inverting output terminal $\overline{Q}$.

This output signal $\overline{Q}A$ of the D type flip-flop 3 is applied to the AND gate G1. The output of the AND gate G1 is input to the counter 1. The output signal $\overline{Q}A$ of the D type flip-flop 3 is as shown in FIG. 2 (4). The counter 1 counts the pulses applied through the AND gate G1 and the counted value is applied to the register 5 as output signal CNTOUT as shown in FIG. 2 (5).

Output signal U of the frequency divider 7 is drawn out as phase-locked loop clock signal PLLCK through the inverting circuit N1 and input to the clock input terminal CK of another D type flip-flop 8 at the same time. Signal of the output terminal Q of the D type flip-flop 3 is input to the input terminal D of the D type flip-flop 8 and applied to the AND gate G2 also. Signal from the output terminal Q of the D type flip-flop 8 is also applied to the AND gate G2. Output of the AND gate G2 is input as reset signal RESET of the counter 1 and applied to the register 5 at the same time.

The register 5 stores output signal CNTOUT of the counter 1 when the output of the AND gate G2 is input and draws out phase difference signal I to the decoder 6. Reset signal RESET which is output from the AND gate G2 is as shown in FIG. 2 (6) and phase difference signal I of the register 5 is shown in FIG. 2 (7). The phase difference signal I of the register 5 is input to the decoder 6. Output E of the decoder 6 is as shown in FIG. 2 (8).

The output U of the frequency divider 7 is applied to the logical circuit 9. The logical circuit 9 draws out the load clock signal F which has waveform as shown in FIG. 2 (9). The frequency divider 7 receives the load signal G representing frequency dividing rate when the load clock signal F is input, frequency-divides the clock pulse MCK from the stationary oscillator 4 and draws out the signal U. The decoder 6 decodes a value obtained by counting the clock pulses MCK from the stationary oscillator 4 for the time from the step-up edge of the input signal PBSG to the step-up edge of the phase-locked loop clock signal PLLCK and applies decoded data to the frequency divider 7 through the data switching circuit 11. The load signal G representing frequency dividing rate applied to the frequency divider 7 from the data changer 11 is shown in FIG. 2 (10). Frequency dividing rate is also shown in FIG. 2 (10).

RS flip-flop 10 is set by the output of the AND gate G2 and reset by the load clock signal F from the logical circuit 9. Signal H from the output terminal Q of this RS flip-flop 10 is as shown in FIG. 2 (11) and applied to the data switching circuit or data changer 11. The data switching circuit 11 applies the output E from the decoder 6 to the frequency divider 7 as load signal G representing frequency dividing rate when the signal H is high level and applies signal representing frequency dividing rate of a predetermined constant N from the constant setting circuit 12 to the frequency divider 7 as load signal G when the signal H is low level. Constant N is "8" in this embodiment for instance.

When phase difference occurs between the step-up edge a2 of the input signal PBSG and the step-up edge b2 of the phase-locked loop clock signal PLLCK during operation, clock pulse MCK from the stationary oscillating circuit 4 is input to the counter 1 through the AND gate G1 and counted and its output signal CNTOUT is applied to the register 5.

As the output signal U of the frequency divider 7 steps up and input to the D type flip-flop 8, step-up waveform of the reset signal RESET is obtained from the AND gate G2, and by the waveform output "3" of the counter 1 is stored in the register 5, phase difference signal D of the register 5 is applied to the decoder 6, and output E representing frequency dividing rate "9" is drawn out from the decoder 6.

The RS flip-flop 10 draws out high level signal H in response to the reset signal RESET from the AND gate G2. Therefore, the data switching circuit 11 is applied with the output E from the decoder 6 as load signal G of the frequency divider 7 and loaded in the frequency divider 7 at the point of time c2 shown in FIG. 2 (9) according to the load clock signal F from the logical circuit 9. The frequency divider 7 conduct frequency dividing operation at the frequency dividing rate "9" in this way.

The R-S flip-flop 10 is reset at the point of time c2 at the step-down edge of the load clock signal F from the logical circuit 9. Therefore, the data switching circuit 11 applies the signal presenting constant N from the constant setting circuit 12 to the frequency divider 7 as load signal G. At the time points d2 and e2 when load clock signal F of the logical circuit 9 is drawn out, constant N is loaded to the frequency divider 7 and frequency dividing operation at N is conducted.

As described above, after rest signal RESET is applied from the AND gate 2, frequency dividing rate "9" to correct the phase difference signal I representing phase difference from the register 5 is loaded in the frequency divider 7 for the time until the time point c2 and in the time points thereafter, frequency dividing rate N (=8) when the phase difference between the signal PBSG and PLLCK is "8" as expected is loaded. This reduces phase difference between f2 at the step-up edge of the input signal PBSG and g2 at the step-up edge of the phase-locked loop clock signal PLLCK as far as possible and reversion of phase is prevented.

In the above described embodiment, the system is composed so that output E from the decoder 6 is loaded to the frequency divider 7 only once when phase difference occurs caused between input signal PBSG and phase-locked loop clock signal PLLCK. As another embodiment, it may be composed so that RS flip-flop 10 is reset after plural number of load clock signal F of the logical circuit 9 are generated, output E of the decoder 6 is loaded to the frequency divider 7 predetermined multiple number of times, and then load signal G from the data switching circuit 11 is loaded to the frequency divider 7.

As described above, according to this embodiment, frequency dividing rate corresponding to the phase difference between input signal and phase-locked loop clock signal is set and loaded to the frequency divider from frequency dividing rate changing circuit and thereafter a predetermined frequency dividing rate value from the frequency dividing rate constant setting means is set to the frequency divider, and therefore increase of phase difference is prevented, phase of the phase-locked loop clock signal coincides with that of input signal and characteristics of the phase-locked loop system is improved. Composition of this embodiment is relatively simple and therefore can be operated sufficiently near the limit of response speed of logical circuit components.

Second embodiment

A second embodiment of this invention will be described below referring to FIGS. 3 to 8.

Figure 3:
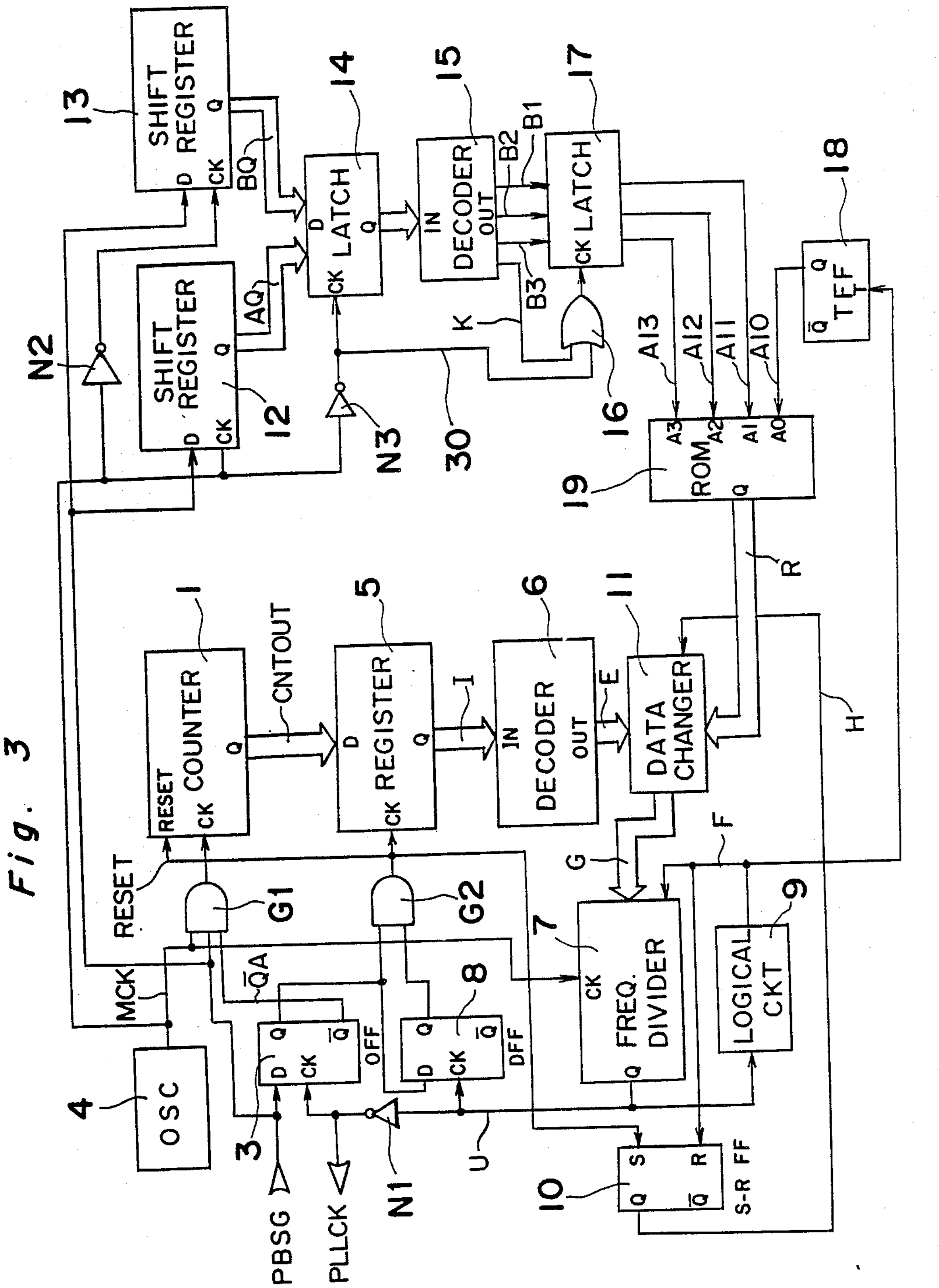
FIG. 3 is a block diagram of a second embodiment of this invention.

FIG. 3 is a general block diagram of this embodiment. This embodiment is partially similar to the composition shown in FIG. 1. Therefore parts of this embodiment corresponding to the composition of the embodiment is indicated with a reference mark and its explanation is omitted. Notable in this embodiment is that two shift registers 12 and 13 are provided to detect frequency components of the input signal PBSG based on the clock pulse MCK of the stationary oscillator 4. The input signal PBSG is input to the data input terminal D of these shift registers 12 and 13 respectively.

The input signal PBSG is applied to the clock input terminal CK for the shift register 12 on one side and to the clock input terminal CK through the inverting circuit N2 to other shift register 13. There shift registers 12 and 13 count the number of clock pulses input to the clock input terminal CK during the term while high-level signal is being applied to the data input terminal D and shift the input signal PBSG in succession.

Figure 4:
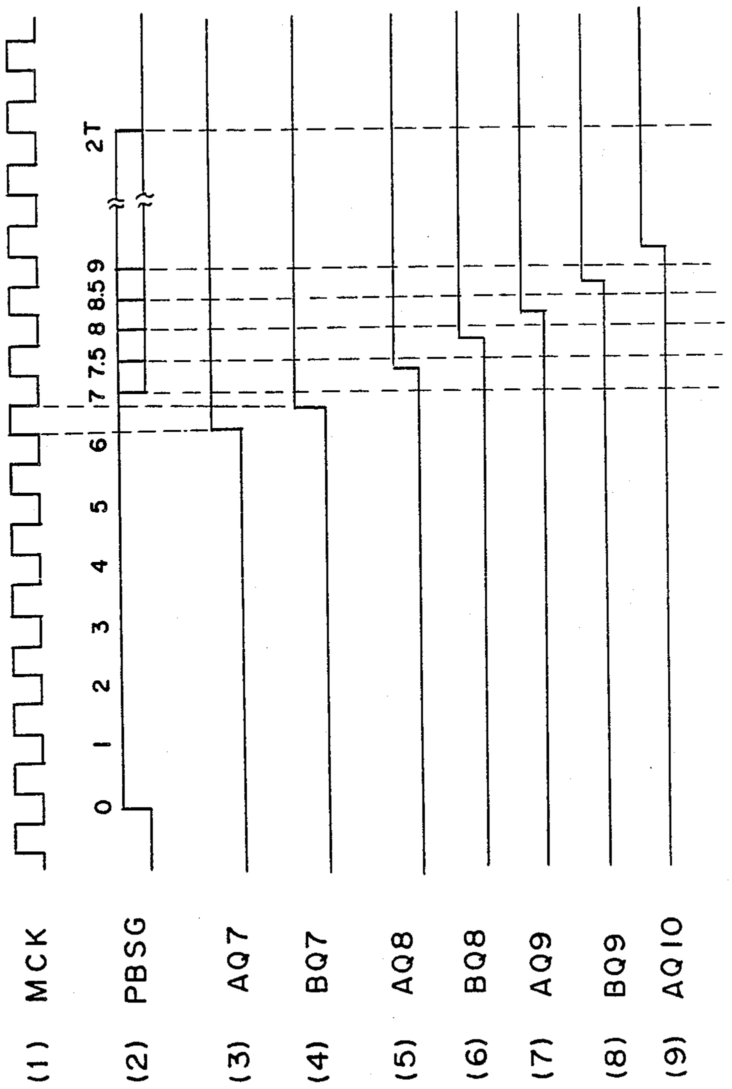
FIGS. 4 and 5 are waveform diagrams showing the input signal PBSG and output signal of shift registers 12 and 13.

The waveform of the clock pulse MCK from the stationary oscillator 4 is shown in FIG. 4 (1) and the waveform of the input signal PBSG in FIG. 4 (2). Assuming the output of the 7 th cell of the shift register 12 to be AQ7, output of the 8 th cell to be AQ8, the output of the 9 th cell to be AQ9, and the output of the 10 th cell to be AQ10, they are shown in FIG. 4 (3), (5), (7), and (9) respectively. Assuming the output of the 7 th cell of the shift register 13 to be BQ7, output of the 8 th cell to be BQ8, and output of the 9 th cell to be BQ9, they are shown in FIG. 4 (4), (6) and (8) respectively. Output of the shift registers 12 and 13 are collectively shown by the reference marks AQ and BQ respectively. These outputs are applied to the latch circuit 14.

Clock pulse MCK from the stationary oscillator 4 is inverted by the inverting circuit N3 and input to the clock input terminal CK of the latch circuit 14 and the output AQ and BQ of the shift registers 12 and 13 are respectively latched based on this clock input signal. The numeral assigned to the input signal PBSG in FIG. 4 (2) indicates the number of clock signals from the stationary oscillator 4, that is the length of the high-level term.

The signals latched by the latch circuit 14 vary, as shown in Table 1 below, according to the number of clock pulses 7–9 and 2T of the stationary oscillator 4 in the length of term where the input signal PBSG is at high level by 0.5 step. This result corresponds to frequencies of the input signal PBSG. Here T is the number of pulses of the clock signal, "8" from the stationary oscillator 4, which is the expected cycle value of the input signal PBSG.

Figure 5:
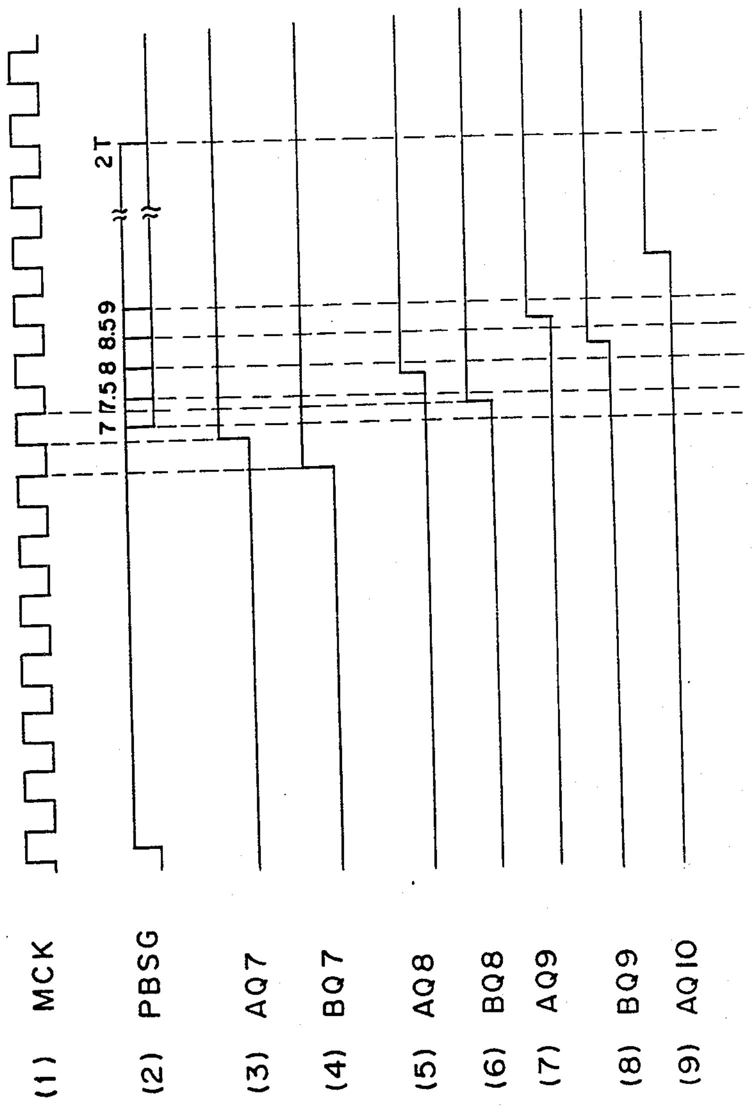

FIG. 5 (1)–(9) show the signal waves corresponding respectively to FIG. 4 (1)–(9). FIG. 5 shows a a case that the phase of the input signal PBSG

TABLE 1

| Length of PBSG | 7 | | 7.5 | | 8 | | 8.5 | | 9 | | 2T | |
|---|---|---|---|---|---|---|---|---|---|---|---|---|
| Shift register | 12 | 13 | 12 | 13 | 12 | 13 | 12 | 13 | 12 | 13 | 12 | 13 |
| AQ7 | 1 | 1 | 1 | 1 | 1 | 1 | 1 | 1 | 1 | 1 | 1 | 1 |
| BQ7 | 1 | 1 | 1 | 1 | 1 | 1 | 1 | 1 | 1 | 1 | 1 | 1 |
| AQ8 | 0 | 0 | 1 | 0 | 1 | 1 | 1 | 1 | 1 | 1 | 1 | 1 |
| BQ8 | 0 | 0 | 0 | 1 | 1 | 1 | 1 | 1 | 1 | 1 | 1 | 1 |
| AQ9 | 0 | 0 | 0 | 0 | 1 | 0 | 1 | 1 | 1 | 1 | 1 | 1 |
| BQ9 | 0 | 0 | 0 | 0 | 0 | 1 | 1 | 1 | 1 | 1 | 1 | 1 |
| AQ10 | 0 | 0 | 0 | 0 | 0 | 0 | 0 | 0 | 1 | 1 | 1 | 1 |
| A1 | 0 | | 1 | | 0 | | 1 | | 0 | | — | |
| A2 | 0 | | 0 | | 1 | | 1 | | 0 | | — | |
| A3 | 0 | | 0 | | 0 | | 0 | | 1 | | — | |

TABLE 1-continued

| Length of PBSG | 7 | | 7.5 | | 8 | | 8.5 | | 9 | | 2T | |
|---|---|---|---|---|---|---|---|---|---|---|---|---|
| Shift register | 12 | 13 | 12 | 13 | 12 | 13 | 12 | 13 | 12 | 13 | 12 | 13 |
| K | 0 | | 0 | | 0 | | 0 | | 0 | | 1 | |

The input signal PBSG is digitally modulated and include those of twice or 3 times the expected cycle T. The above described embodiment shows a case of 2T in maximum cycle.

The decoder 15 applies 3 bits in total, output B1, B2, and B3, in response to the output of the latch circuit 14 and applies the output K suitable to the cycle of 2T or more to OR gate 16. The output of the inverting circuit N3 is also applied to this OR gate 16 through the line 30. The output of the OR gate 16 is input to the clock input terminal CK of the latch circuit 17.

The latch circuit 17 latches the output B1, B2, and B3 of the decoder 15 only when the output K is logical "0", that is, only when the term of high level of the input signal PBSG is between the number of pulses 7–9 of the stationary oscillator 4. This enables to prevent malfunction when the term of high level of the input signal PBSG is more than 2T. The output All, A12, and A13 from the latch circuit 17 correspond respectively to the output A1, A2, and A3 of the decoder 15 and are input to the read only memory (ROM) 19.

Now another signal A10 is output from the output terminal Q of the T type flip-flop (TFF) 18 and input to the read only memory 19. The load clock signal F from the logical circuit 9 is applied to the T type flip-flop 18 also and the T type flip-flop 18 inverts the logical state of the signal of the output terminal Q every time of receiving the load clock signal F. This read only memory 19 receives the previously described signals A10–A13 as address signal, draws out the output R of 4 bits from the output terminal Q, and applies it to the data switching circuit 11. Contents of the read only memory 19 are shown in Table 2.

TABLE 2

| A3 | A2 | A1 | A0 | Output R of ROM19 | Cycle of PBSG |
|---|---|---|---|---|---|
| 0 | 0 | 0 | 0 | 9 | 7 |
| 0 | 0 | 0 | 1 | | |
| 0 | 0 | 1 | 0 | 8 | 7.5 |
| 0 | 0 | 1 | 1 | 9 | |
| 0 | 1 | 0 | 0 | 8 | 8 |
| 0 | 1 | 0 | 1 | | |
| 0 | 1 | 1 | 0 | 7 | 8.5 |
| 0 | 1 | 1 | 1 | 8 | |
| 1 | 0 | 0 | 0 | 7 | 9 |
| 1 | 0 | 0 | 1 | | |

Figure 6:
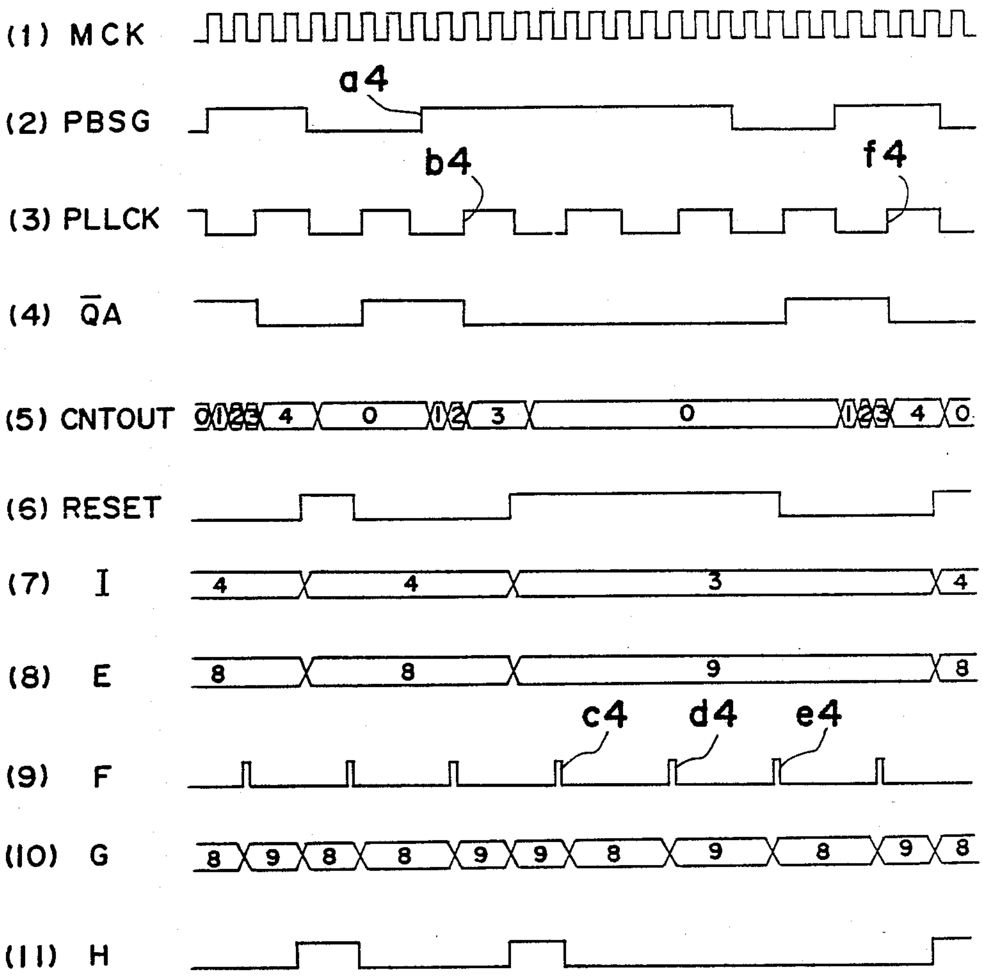
FIGS. 6, 7, and 8 are waveform diagrams to explain operation of the embodiment as shown in FIG. 3.
Figure 7:
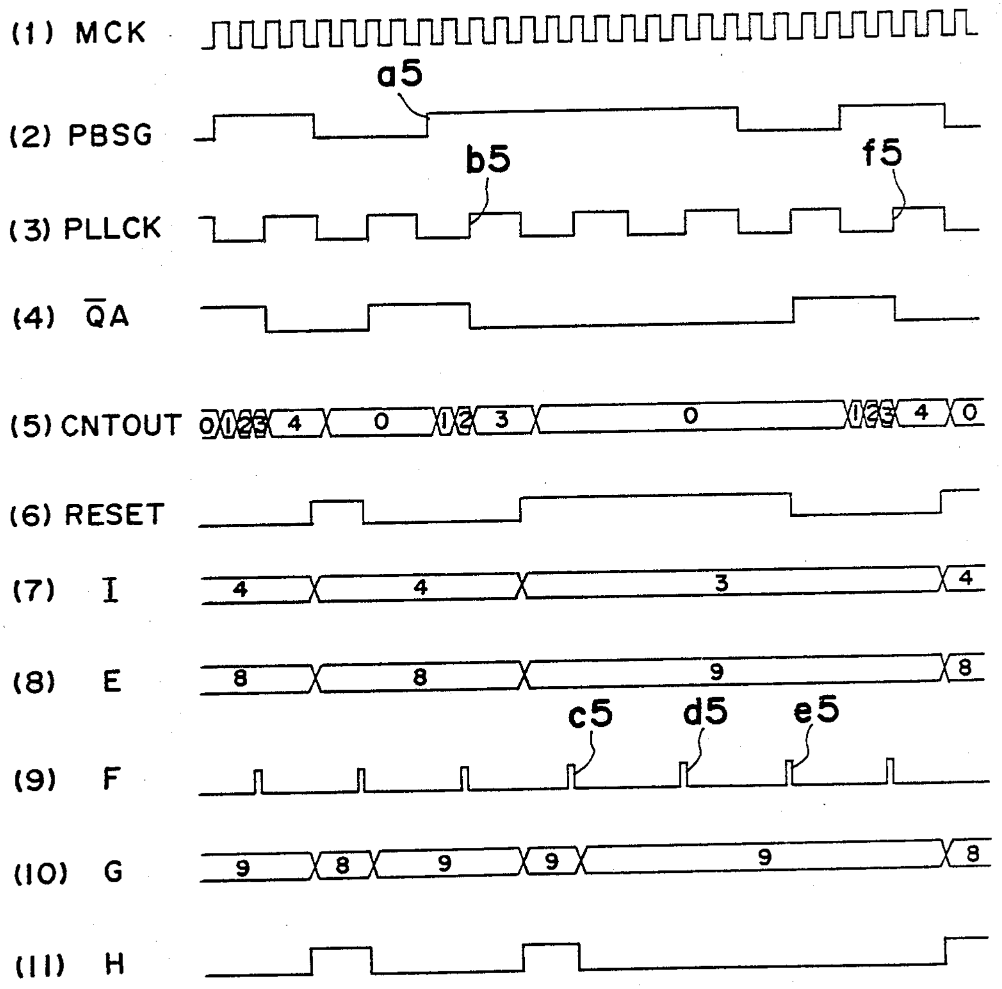
Figure 8:
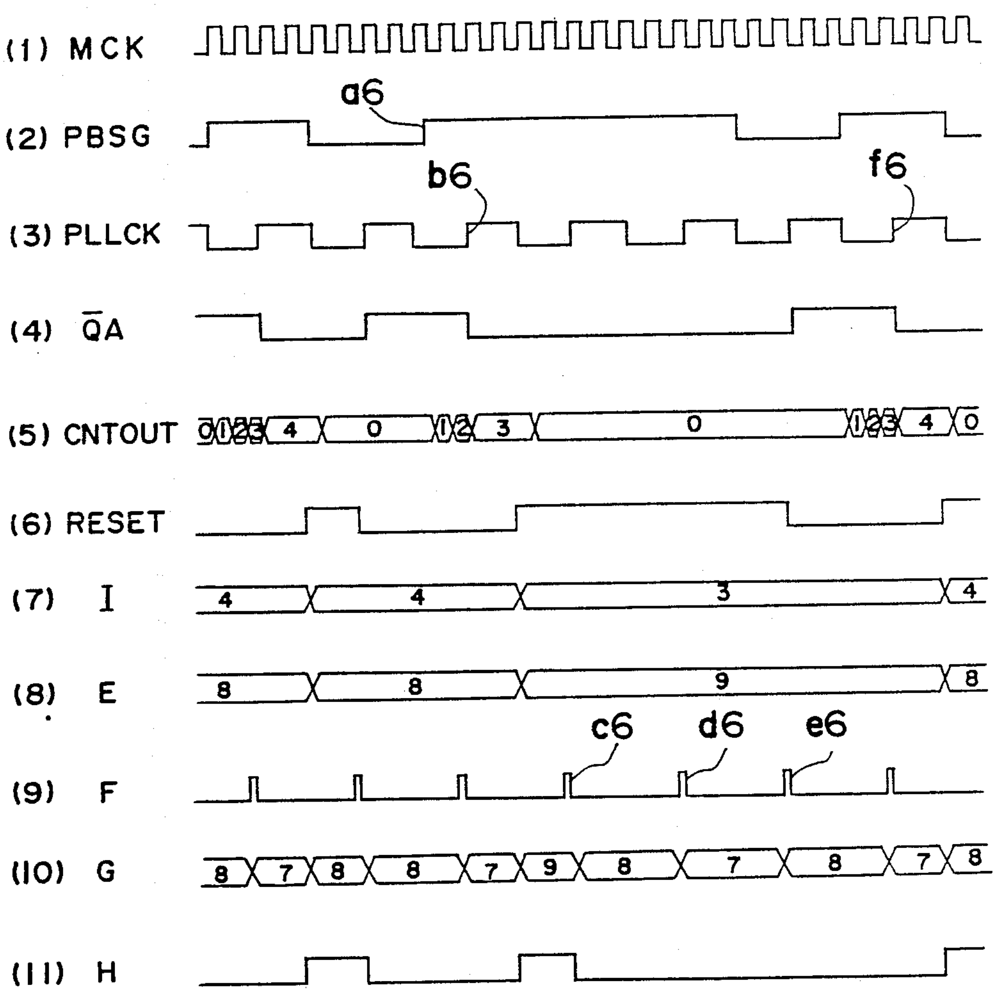

The output R of the read only memory 19 varies according to the input. Such state is shown in FIGS. 6–8. FIG. 6 (1) shows the waveform of the clock pulse MCK of the stationary oscillator 4, FIG. 6 (2) shows the waveform of the input signal PBSG, and FIG. 6 (3) shows the waveform of the phase-locked loop clock signal PLLCK. The output signal $\overline{Q}$A of the D type flip-flop 3 is shown in FIG. 6 (4) and the output CNTOUT of the counter 1 is shown in FIG. 6 (5).

The reset signal RESET from the AND gate G2 is shown in FIG. 6 (6). The phase difference signal D of the register 5 is shown in FIG. 6 (7) and the output E of the decoder 6 is shown in FIG. 6 (8). The load clock signal F of the logical circuit 9 is shown in FIG. 6 (9). The signal H from the output terminal Q of the RS flip-flop 10 is shown in FIG. 6 (11). When this signal H is at high level, the output E of the decoder 6 is loaded to the frequency divider 7 as load signal G, and when the output H is at low level, the data switching circuit 11 loads the output R of the read only memory 19 to the frequency divider 7 as load signal G. The load signal G is shown in FIG. 6 (10).

FIG. 7 (1)–(11) and FIG. 8 (1)–(11) correspond to each waveform of above described FIG. 6 (1)–(11). Thus, the in the case of FIG. 6 where the cycle of the input signal PBSG is 7.5 times the clock pulse MCK of the stationary oscillator 4, the output R of the read only memory 19 outputs alternately "8" and "9" as load signal G.

When the cycle of the input signal PBSG is 7 times the clock pulse MCK of the stationary oscillator 4, the output R of the read only memory 19 is "9" as shown in FIG. 7, which is drawn out as the load signal G.

When the cycle of the input signal PBSG is 8.5 times the clock pulse MCK of the stationary oscillator 4, the output R of the read only memory 19 is "7" and "8" alternately as shown in FIG. 8, which is drawn out as the load signal G. In this way, in FIGS. 6–8, when the phase deviation between the step-up edge of the input signal PBSG and step-up edge of the phase-locked loop clock signal PLLCK, a4–b4, a5–b5, and a6–b6 is at the time point c4, d4, e4; c5, d5, e5; and c6, d6, e6 of step-down edge of the load clock signal F of the logical circuit 9,the frequency dividing rate of the load signal G can be changed, and therefore phase deviation does not occur at the time points f4, f5, and f6.

As described above, even though the cycle of the input signal PBSG varies between 7 to 9 times the clock pulse MCK from the stationary oscillator 4, phase-locked loop rock range is remarkably improved to the variation of the frequencies of the input signal PBSG within the range and unlocking is prevented.

In the above-described embodiment, 2 shift registers 12 and 13 are used and accuracy of the frequency detection of the input signal PBSG could be increased to one-half of the clock pulse MCK of the stationary oscillator 4. By increasing the number of the shift registers 12 and 13, it is possible to improve the measuring accuracy of the input signal PBSG.

In the above described embodiment, the output of the read only memory 19 is drawn out alternately as "8" and "9", and "7" and "8", in order to make the frequency of the input signal PBSG 7.5 or 8.5 times the clock pulse MCK of the stationary oscillator 4. By drawing out the output of the read only memory 19 in other mode as another embodiment of this invention, locking corresponding to the cycle of the input signal PBSG becomes possible corresponding to the cycle of the input signal PBS.

As described above, according to this invention, frequency dividing rate corresponding to the phase difference between input signal and phase-locked loop clock signal is set by the frequency dividing rate changing circuit, and then frequency dividing rate corresponding to frequency components of the input signal is determined and the frequency divider is operated under the frequency dividing rate adjusting means. Therefore, even though an input signal varies and drifts in a wide range, phase-locked loop can be locked at favorable characteristics, phase deviation between input signal and phase-locked loop clock signal can be prevented, with simple composition.

Third embodiment

A third embodiment of this invention is shown referring to FIGS. 9 to 15.

Figure 9:
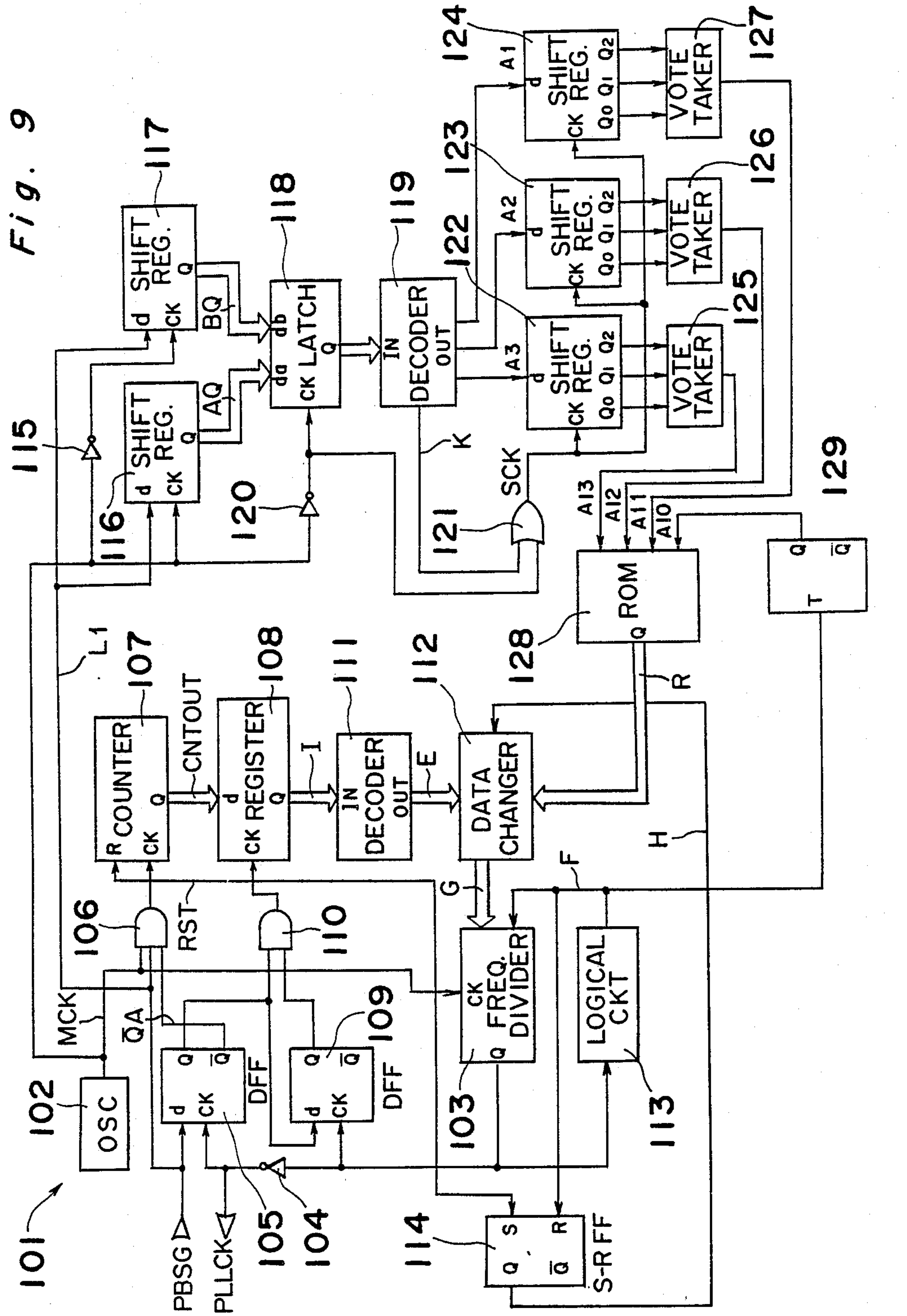
FIG. 9 is a block diagram showing electrical composition of a phase-locked loop system of a third embodiment of this invention.
Figure 10:
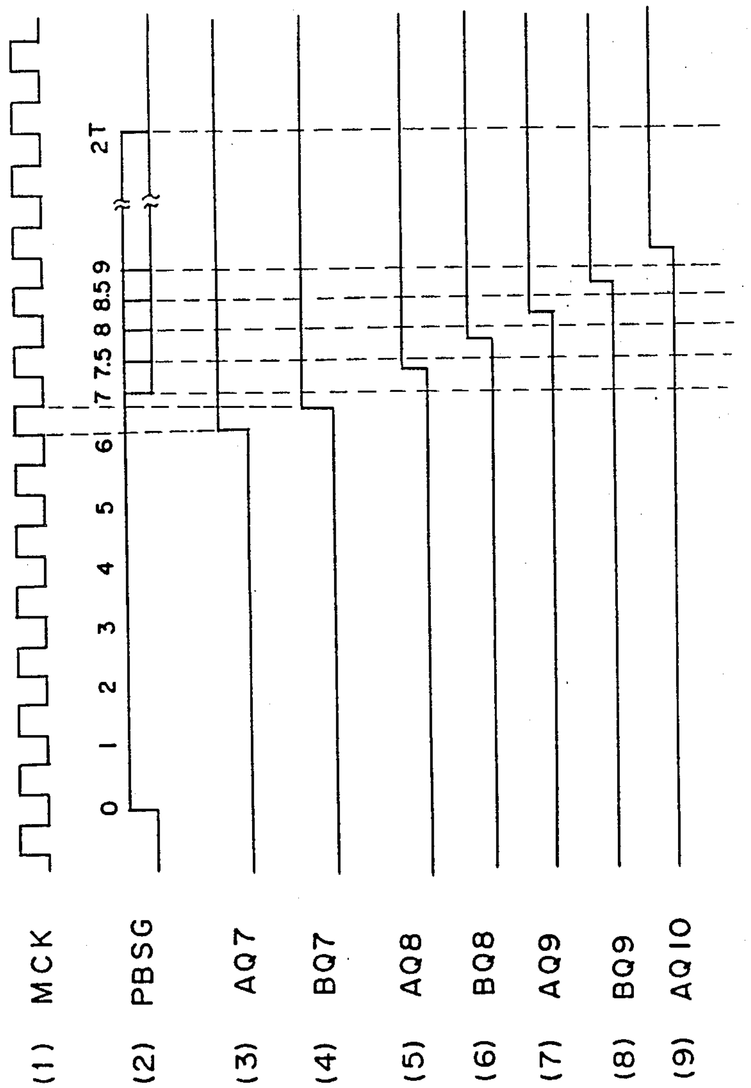
FIGS. 10 and 11 are timing charts showing signal waveform at each part of the said system.
Figure 11:
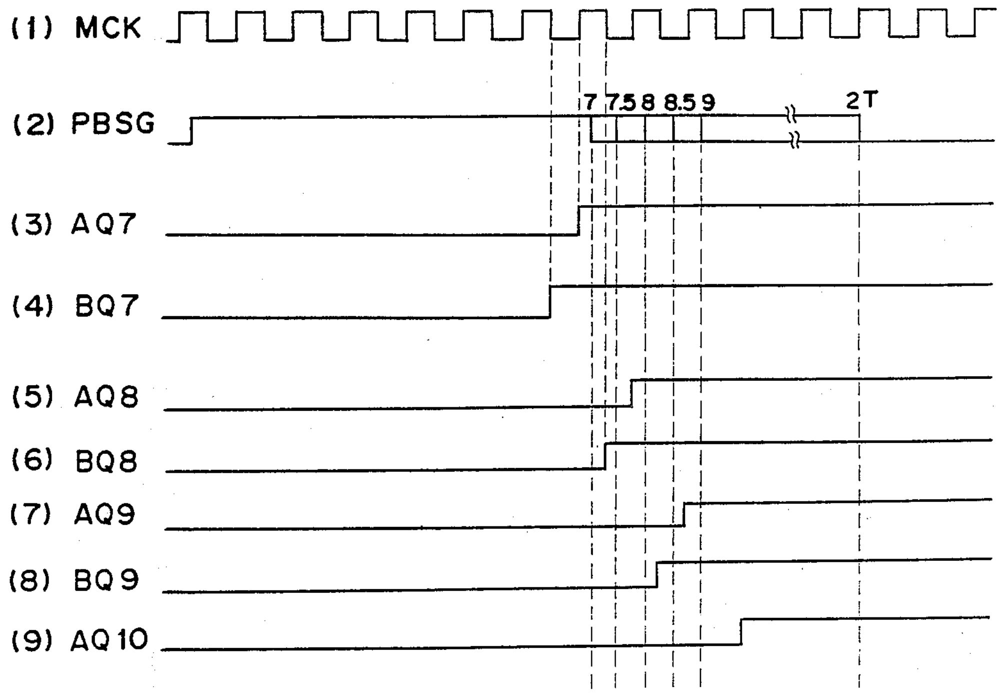
Figure 12:
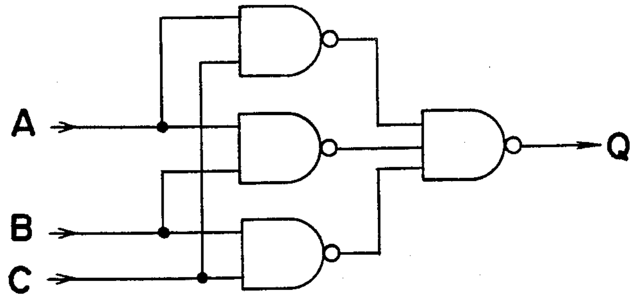
FIG. 12 is an electrical circuit diagram of a vote taker.

FIG. 9 is a block diagram showing electrical composition of the digital PLL system 101 of this embodiment similar to the composition of the first and second embodiments as shown in FIGS. 1 and 3 respectively. FIGS. 10 and 11 are timing charts showing waveforms of signals at each part. Operation of this embodiment is described below referring to FIGS. 9, 10, and 11.

One of the features of this embodiment is that a plural number of shift registers 116 and 117 are provided to detect the frequency components of the input signal PBSG based on the clock pulse MCK of the stationary oscillator 102. The input signal PBSG is input to the data input terminal d of the said shift registers 116 and 117 respectively through line L1.

The waveform shown in FIG. 10 (1) shows the waveform of the clock signal MCK output from the stationary oscillator 102. The input signal PBSG input to the first shift register 116 is shifted in succession by the clock signal MCK as shown in FIG. 10 (2). The input signal PBSG input to the second shift register 117 is shifted in succession at the timing of the negative phase clock signal $\overline{MCK}$ when the said clock signal MCK is inverted by the inverter 115 as shown in FIG. 11 (1). The shift output AQ and BQ output in succession after being shifted in this way are input to the data input terminal da and db of the latch circuit 118 separately and latched at the timing at the step-down edge of the said input signal PBSG.

Assuming the output corresponding to 7th to 10th of the first shift register 116 respectively to be AQ7–AQ10, output AQ7–AQ10 of the first shift register 116 are shown in FIG. 10 (3), (5), (7) and (9), and, assuming the output corresponding to 7th to 9th of the second shift register 117 respectively to be BQ7–BQ9, the output BQ7–BQ9 of the second shift register 117 are shown in FIG. 10 (4), (6) and (8). FIG. 0, 1, 2, 3, . . . attached to the waveform of the input signal PBSG in FIG. 10 (2) show the number counted by the said clock signal MCK during the term when the input signal PBSG is at high level, that is the length of high level term of the input signal PBSG.

Signals latched to the latch circuit 118 vary in 0.5 steps to the counted Nos. 7–9 and 2T by the said clock signal MCK while the input signal PBSG is at high level, as shown in table 3, according to the length during the high level term of the input signal PBSG and the result corresponds to the frequency of the input signal PBSG.

TABLE 3

| Length of PBSG | 7 | | 7.5 | | 8 | | 8.5 | | 9 | | 2T | |
| --- | --- | --- | --- | --- | --- | --- | --- | --- | --- | --- | --- | --- |
| Shift register | 12 | 13 | 12 | 13 | 12 | 13 | 12 | 13 | 12 | 13 | 12 | 13 |
| AQ7 | 1 | 1 | 1 | 1 | 1 | 1 | 1 | 1 | 1 | 1 | 1 | 1 |
| BQ7 | 1 | 1 | 1 | 1 | 1 | 1 | 1 | 1 | 1 | 1 | 1 | 1 |
| AQ8 | 0 | 0 | 1 | 0 | 1 | 1 | 1 | 1 | 1 | 1 | 1 | 1 |
| BQ8 | 0 | 0 | 0 | 1 | 1 | 1 | 1 | 1 | 1 | 1 | 1 | 1 |
| AQ9 | 0 | 0 | 0 | 0 | 1 | 0 | 1 | 1 | 1 | 1 | 1 | 1 |
| BQ9 | 0 | 0 | 0 | 0 | 0 | 1 | 1 | 1 | 1 | 1 | 1 | 1 |
| AQ10 | 0 | 0 | 0 | 0 | 0 | 0 | 0 | 0 | 1 | 1 | 1 | 1 |
| A1 | 0 | | 1 | | 0 | | 1 | | 0 | | — | |
| A2 | 0 | | 0 | | 1 | | 1 | | 0 | | — | |
| A3 | 0 | | 0 | | 0 | | 0 | | 1 | | — | |
| K | 0 | | 0 | | 0 | | 0 | | 0 | | 1 | |

FIG. 11 (1)-(9) show the waveforms corresponding to those in FIG. 10 (1)-(9) in which the phase of the input signal PBSG is deviated from that shown in FIG. 10.

The input signal PBSG is digital modulated and those twice and three times those 1 cycle T are also included. This embodiment shows a case of 2T.

The decoder 119 applies 3 bits of output A1, A2, and A3 respectively and separately to the shift register 122, 123, and 124 in response to the output of the latch circuit 118 and applies the signal K corresponding to the cycle 2T or more to the OR gate 121, and the OR gate 121 prepares shift clock signal SCK by the logical summation of the said signal K and clock signal MCK inverted by the inverter 120. A1, A2 and A3 output to the shift register 122, 123, and 124 are shifted only when the signal K output from the said decoder 119 is 0, that is, only when the term at high level of the input signal PBSG is 7-9 as shown in Table 3, whereby preventing malfunction in the section more than 2T in cycle.

The decode output A1, A2, and A3 of the said decoder 119 shifted by the shift register 122 are input to vote takers 125, 126, and 127 respectively. Here, the vote takers 125-127 are realized by a plural number of NAND gates shown in FIG. 12, for instance, and outputs values occupying 2 of 3 inputs as shown in the truth table in Table 4, by which decoded values of the said decoder 119 can be detected more accurately.

TABLE 4

| C | B | A | Q |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The load data signal R to determine the frequency dividing rate of the frequency divider 103 is prepared by decoding the output A10 of the T flip-flop circuit 129 which conducts toggle operation by the output A11, A12, and A13 from the vote takers 125, 126, and 127 and load clock signal F output from the logical circuit 113, by the read only memory (referred to as ROM hereafter). In other words, addresses of the ROM128 are designated by the output A11, A12 and A13 of the vote takers 125, 126, and 127, and the output A of the T flip-flop circuit 129 and the output Q of the ROM 128 is input to the data changer 112 as load data signal R. Contents of the ROM128 are as shown in Table 5.

Figure 13:
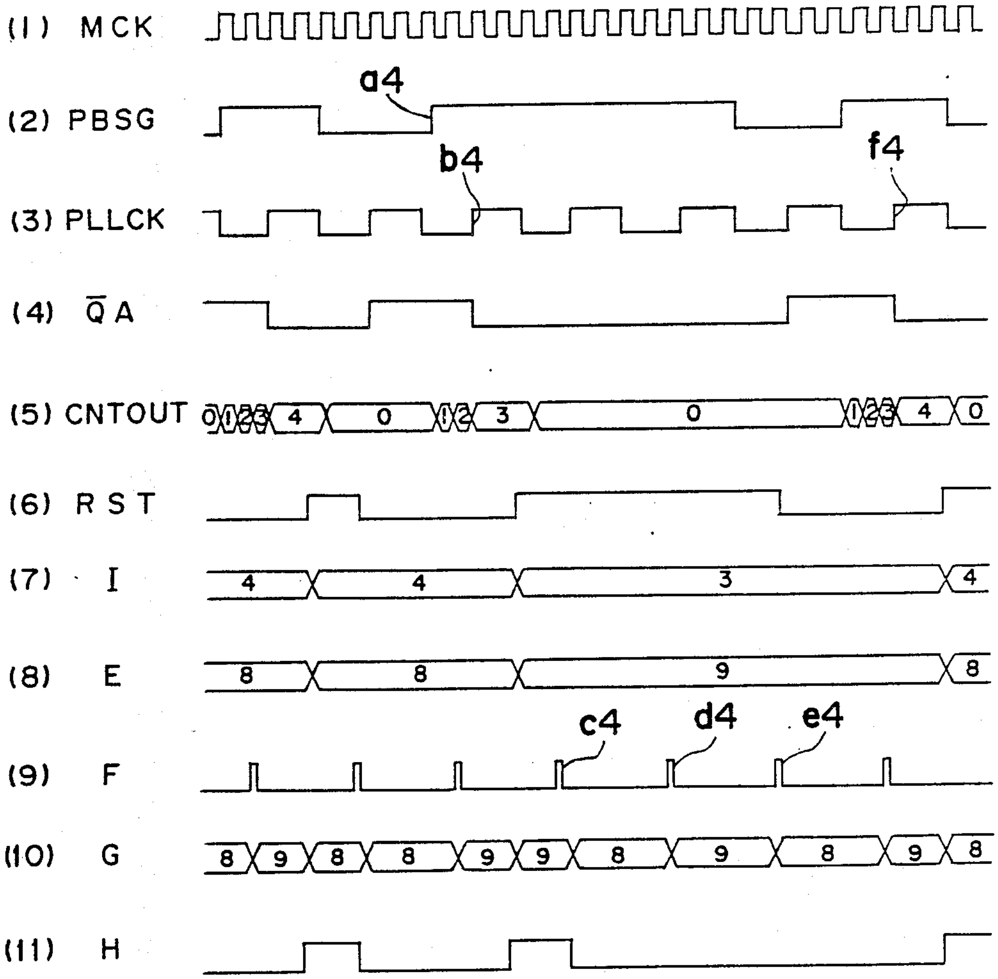
FIGS. 13, 14, and 15 are timing charts showing signal waveform at each part to explain the operation of the third embodiment.
Figure 14:
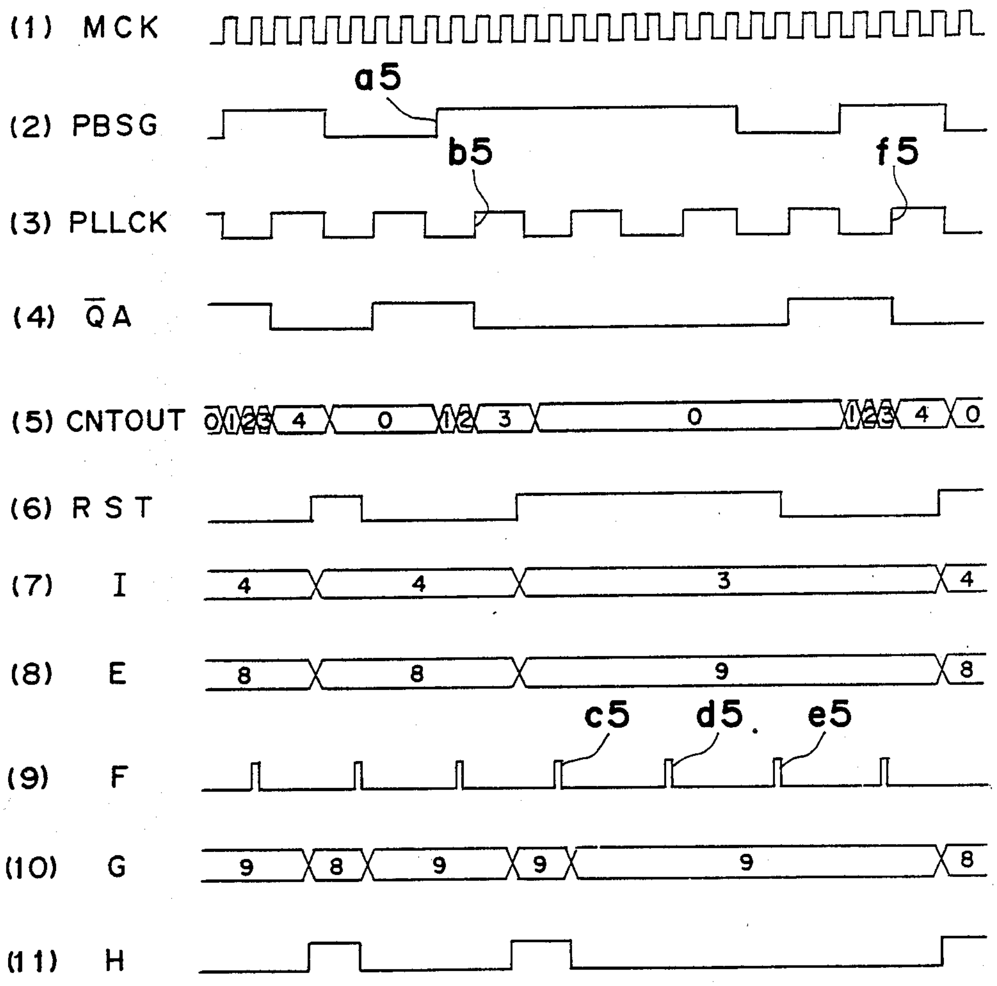
Figure 15:
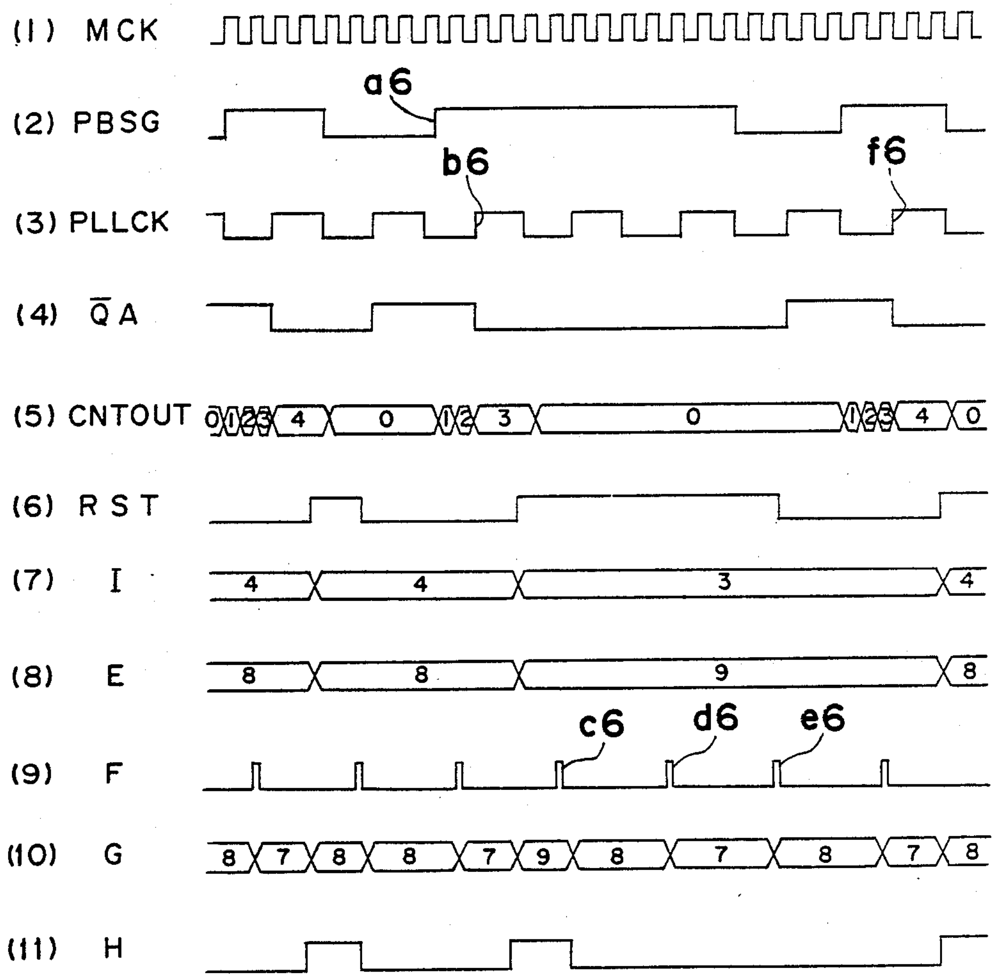

According to the input of the ROM128, the load data signal R, which is its output, varies. The condition of the variation is shown in FIGS. 13, 14, and 15.

TABLE 5

| A13 | A12 | A11 | A10 | Output R of ROM128 | Cycle of PBSG |
|---|---|---|---|---|---|
| 0 | 0 | 0 | 0 | 9 | 7 |
| 0 | 0 | 0 | 1 | | |
| 0 | 0 | 1 | 0 | 8 | 7.5 |
| 0 | 0 | 1 | 1 | 9 | |
| 0 | 1 | 0 | 0 | 8 | 8 |
| 0 | 1 | 0 | 1 | | |
| 0 | 1 | 1 | 0 | 7 | 8.5 |
| 0 | 1 | 1 | 1 | 8 | |
| 1 | 0 | 0 | 0 | 7 | 9 |

TABLE 5-continued

| A13 | A12 | A11 | A10 | Output R of ROM128 | Cycle of PBSG |
|---|---|---|---|---|---|
| 1 | 0 | 0 | 1 | | |

FIG. 13 (1) shows the waveform of the clock signal MCK which is the output of the stationary oscillator 102, FIG. 13 (2) shows the waveform of the input signal PBSG, and FIG. 13 (3) shows the waveform of the PLL clock signal PLLCK. The output $\overline{Q}A$ of the first D-FF circuit 105 is shown in FIG. 13 (4) and the output CNTOUT of the counter 107 is shown in FIG. 13 (5).

The reset signal RST output from the AND gate 110 is shown in FIG. 13 (6), and the waveform of the output signal I of the register 108 is shown in FIG. 13 (7). The waveform of the output signal E of the decoder 111 is shown in FIG. 13 (8), output signal F of the logical circuit 113 in FIG. 13 (9), and the control signal H output from the flip-flop circuit 114 is shown in FIG. 13 (11). When the control signal H is at high level, the data changer 112 inputs the data of the output signal E of the decoder 111 to the frequency divider 103 as load signal G and when the control signal H is at low level, inputs the output signal R of the ROM 128 to the frequency divider 103 as load signal G. The waveform of the load signal G is as shown in FIG. 13 (10)

FIG. 14 (1)-(11) and FIG. 15 (1)-(11) correspond to above described each waveform in FIG. 13 (1)-(11). In this way, in the case as shown in FIG. 13 when the cycle of the input signal PBSG is 7.5 times the clock pulse MCK which is the output of the stationary oscillator 102, the output R of the ROM 128 outputs "8" and "9" alternately and apply them to the frequency divider 103 through the data changer 112 as load signal G. When the cycle of the input signal PBSG is 7 times the clock pulse MCK which is the output of the stationary oscillator 102, the output R of the ROM 128 is "9" as shown in FIG. 14, which is input to the frequency divider 103 as the load signal G.

When the cycle of the input signal PBSG is 7.5 times the clock pulse MCK which is the output of the stationary oscillator 102 as shown in FIG. 15, the load data signal R which is the output of the ROM 128 outputs "7" and "8" alternately and applies them to the frequency divider 103 through the data changer 112 as the load signal G. In this way, in FIGS. 13-15, at the time points c4, d4, e4; c5, d5, e5; c6, d6, e6 at which the phase deviation in a4-b4, a5-b5, and a6-b6 between the step-up edge of the input signal PBSG and the step-up edge of PLL clock signal PLLCK, is the output signal F of the logical circuit 113, the frequency dividing rate of the load signal G can be set and therefore phase devication does not occur at time point of f4, f5, and f6.

Thus, even if the input signal PBSG is applied up to the cycle 7-9 of the clock signal MCK from the stationary oscillator 102 shown in FIGS. 10 and 11, the lock range of PLL is remarkably improved and unlocking is prevented to the variation of the frequency of the input signal PBSG in that range.

In the above-described embodiment, two shift registers 116 and 117 are used and the frequency detecting accuracy of the input signal PBSG can be increased to a half of the clock signal MCK of the stationary oscillator 102 by them. By increasing the number of the shift registers, the detecting accuracy of the input signal PBSG can be further improved.

In the above described embodiment, the output of the ROM 128 is drawn out alternately as "8", "9", and "7", "8", in order to make the frequency of the input signal PBSG 7.5 or 8.5 times the clock signal MCK of the stationary oscillator 102. By drawing out the output of the ROM 128 in other mode as another embodiment of this invention, locking can be effected under individual control corresponding to the cycle of the input signal PBSG.

As described above, according to this embodiment, since a frequency dividing rate corresponding to phase difference between input signal and PLL clock signal is set by the frequency dividing rate setting circuit and then the frequency dividing rate corresponding to the frequency components of the input signal is set by the frequency dividing rate adjusting means, such a phase locked loop (PLL) system can be realized that looking of the PLL can be done with favorable characteristics even if the input signal varies in wide range and drifts, even for input signals of high speed near the limit of the processing speed of the logical circuit and even though the circuit composition is simple.

Fourth embodiment

A fourth embodiment of this invention is described below referring to FIGS. 16 and 17.

Figure 16:
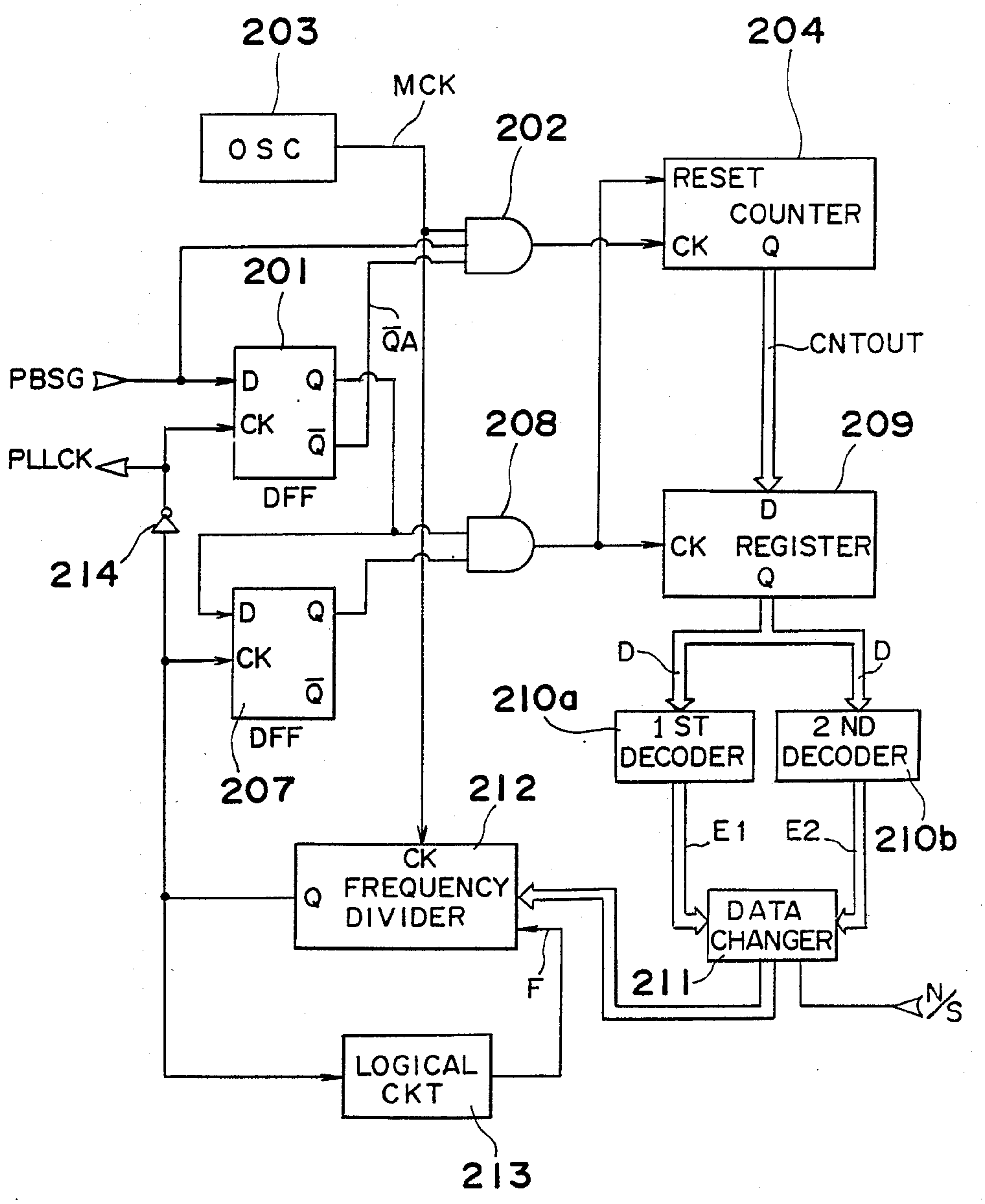
FIG. 16 is a circuit diagram showing a fourth embodiment of a digital phase-locked loop system according to this invention.
Figure 17:
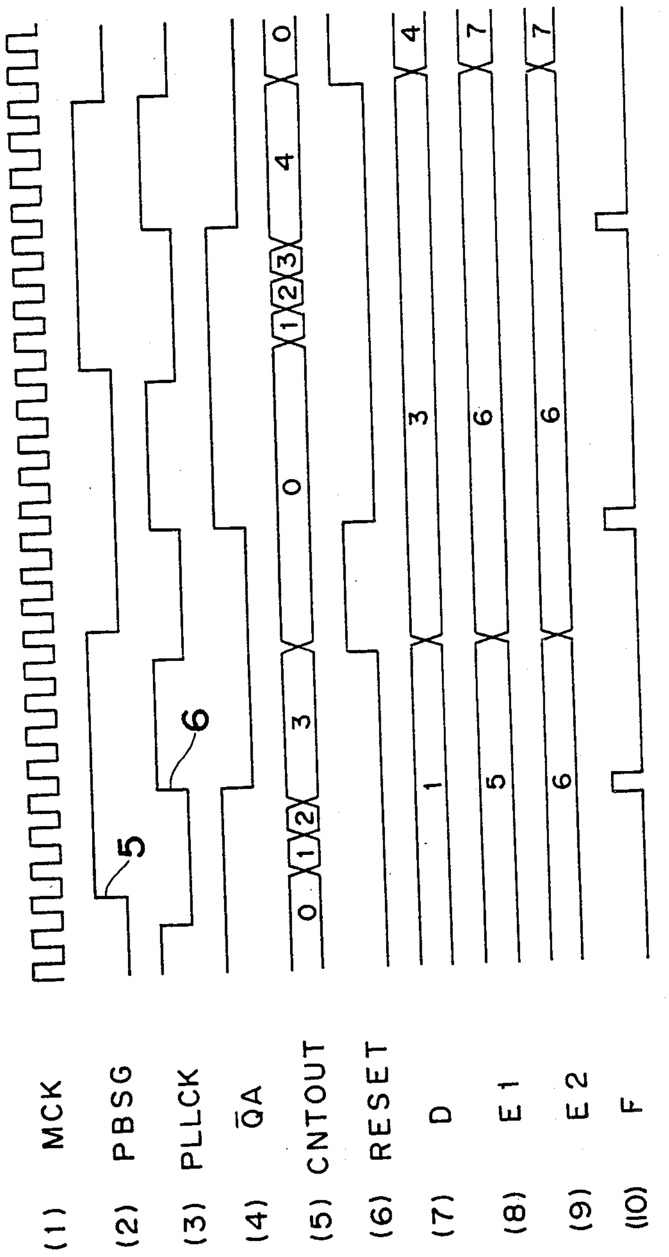
FIG. 17 is a timing chart showing the operation of the said system.

FIG. 16 is a circuit diagram showing a digital PLL system according to this embodiment, and FIG. 17 is a timing chart showing operation of this circuit.

The digital PLL system of this embodiment is used to read signals reproduced in the normal mode and search mode in DAT, etc.

In FIG. 16, reproduced signal PBSG is input to the D-flip-flop 201, latched there at the step-up edge of the reproducing clock PLLCK input to the clock terminal (CK) and input to the AND gate 202 together with the inversion output ($\overline{Q}$A) of the D flip-flop 201. Basic clock MCK output from the stationary oscillator 203 has been input to this AND gate 202 and logical product of the 3 input signals, PBSG, $\overline{Q}$A, and MCK, is obtained. This logical product is made the clock input to the counter 204. Then, the counter 204 counts the phase difference between the reproducing signal PBSG and reproducing PLL clock PLLCK (term from the step-up edge 5 of PBSG to the step-up edge 6 of PLLCK in FIG. 17) with the basic clock MCK as the unit.

Logical product of the Q output of the D flip-flop 207 which latches the Q output of the said D flip-flop 201 at the step-up edge of the signal of PLLCK inverted again ($\overline{PLCK}$) and the Q output of the said D flip-flop 201 is obtained by the AND gate 208. This logical product (called RESET signal) becomes clock of the register 209 which latches the output CNTOUT of the said counter 204. This clock becomes the RESET signal to the counter 204 at the same time, the counter 204 is reset by this RESET signal, and the next counting operation is started from the step-up edge 5 of the next PBSG. In the register 209, the said CNTOUT is latched synchronously with the step-up edge of the RESET signal. The said $\overline{PLLCK}$ is made PLLCK by the inverter 214.

The value latched to the register 209 is obtained by counting the phase difference between the said PLLCK and PBSG with MCK as the unit and the value (D) is input to the first and second decoders 210a and 210b respectively. Either output of the signal E1, E2 decoded by these decoders 210a, and 210b is selected by the data changer 211 and loaded to the frequency divider 212 as a frequency dividing rate of the frequency divider 212 generating PLLCK.

In this embodiment, the data changer 211 selects the first decoder 210a at the time of normal reproduction and the second decoder 210b at the time of search by normal/search switching signal N/S. The data load to the frequency divider 212 is synchronous with the clock (F) output from the logical circuit 213 when the output of the frequency divider 212 becomes a specified value.

The first decoder 210a decodes the output of 5 - B when the said register output (D) varies to 0 - F in hexadicimal indication. The decoding features correct the frequency dividing rate of the said frequency divider 212 remarkably when the phase deviation is large (D near 0 or F) but correct it very little when the phase deviation is small (D near 8). On the other hand, the second decoder 210b decodes the output of 6 - A when the said register output D varies to 0 - F in hexadecimal indication. The decoding features correct the frequency dividing rate of the said frequency divider 212 approximately in proportion to the phase deviation.

Table 6 shows the relation between the first decoder output (El) and second decoder output (E2) to the said register output (D).

TABLE 6

| Register output (D) | First decoder output (E1) | Second decoder output (E2) |
|---|---|---|
| 0 | 5 | 6 |
| 1 | | |
| 2 | 6 | |
| 3 | | |
| 4 | 7 | 7 |
| 5 | | |
| 6 | 8 | |
| 7 | | 8 |
| 8 | | |
| 9 | | |
| A | | 9 |
| B | 9 | |
| C | | |
| D | A | A |
| E | | |
| F | B | |

As described above, first and second decoders 210a and 210b have decoding characteristics as shown in Table 6 and the register output (D) changes 1-3-4 and E1 changes 5-6-7, while E2 changes 6-6-7, in the timing chart of FIG. 17. It is because El and E2 have different values though the register output (D) is the same [1]in Table 6 that the initial values of E1 and E2 are different [5]and [6].

Block error rate and lock range at normal time which show the reproducing characteristics of the reproducing signal of DAT using the digital PLL system composed as described above were measured as shown in Table 7.

TABLE 7

| | When 1st decoder is selected | When 2nd decoder is selected |
|---|---|---|
| Block error rate at normal time | $\sim 10^{-4}$ | $\sim 10^{-3}$ |
| Lock range | ±2% | ±3.5% |

According to Table 7, the lock error rate of the first decoder 210a is about $10^{-4}$ and can be sufficiently used practically but that of the second decoder 210b is about $10^{-3}$, worse than the former by 1 digit. However, the block error rate with which index and other codes can be read at the time of search is about $10^{-2}$. When the range to which the tape speed variation is allowed at the block error rate of about $10^{31\,2}$, that is the lock range, is measured, the lock range is only about ±2% if the first decoder 210*a* is selected but extends to about ±3.5% if the second decoder 210*b* is selected, which cannot be adapted to the PLL circuit of the search mode. Thus, only by selecting the decoder and switching to it, PLL circuit adaptable to both the normal and search modes is obtained.

As described above, according to this embodiment, PLL circuit which can be adapted to both modes by switching the decoders can be composed for a reproducing system provided with different speed modes. In addition, since the circuit composition is simple, the signal delay is a little and raises no problem for practical use even when operated near the speed limit of the logical circuit.

Fifth embodiment

A fifth embodiment of this invention is described below in details referring to FIGS. 18 to 20.

Figure 18:
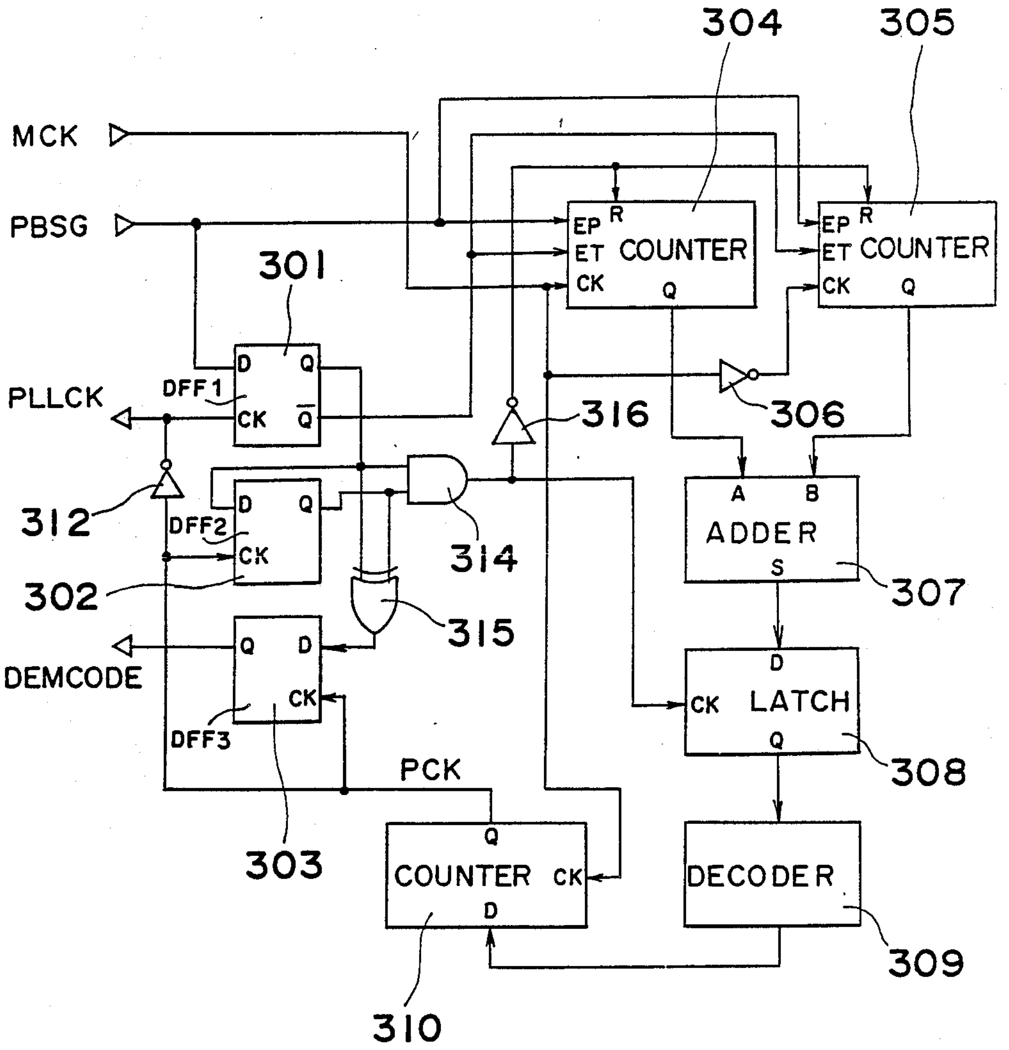
FIG. 18 is a block diagram of a fifth embodiment of a digital phase-locked loop system of this invention.

In FIG. 18, a reference numeral 301 indicates D flip-flop 1 (DFF1) to latch the input data which is non-return-to-zero change on (NRZ) 1-converted playback signal (PBSG) by reproducing clock (PLLCK). The said DFF1 301 outputs the Q output to DFF2 302, and outputs the $\overline{Q}$ output to the counters 304 and 305 on the other hand. The said counters 304 and 305 count up when the said PBSG and $\overline{Q}$ output are input to the enable terminals EP and ET respectively and both EP and ET are 1. Basic clock (MCK) is input to the CK terminal of the said counter 304 and the said MCK is inverted by the inverter 306 and input to the CK terminal of the said counter 305. The said counter 304 detects the time from step-up edge of the said PBSG to the step-up edge of PLLCK (phase difference) at the step-up edge of MCK and the said counter 305 detects it a the step-down edge of MCK. The adder 307 adds the phase difference detected by the counters 304 and 305 and outputs the results to the latch 308. The latch 308 latches the addition results immediately before the counters 304 and 305 are reset and output the result to the decoder 309. The said decoder 309 outputs "7" when the output of the latch 308 is 0–5, "8" when it is 6–9, or "9" when A–F to the counter 310 as a frequency divider. The said counter 310 outputs clock PCK prepared by frequency-dividing MCK based on the output from the said decoder 309 to DFF2 302 and DFF3 303, while outputs it to DFF1 301 through the inverter 312. The said DFF2 302 latches the Q output of DFF1 301 by the said PCK and outputs the result to the AND circuit 314 and EXOR circuit 315. This AND circuit 314 receives Q output of DFF1 301 and Q output of DFF2 302 and outputs reset signal to the counters 304 and 305 through the inverter 316, while it outputs latch clock to the latch 308. On the other hand, the said EXOR circuit 315 receives Q output of DFF1 301 and Q output of DFF2 302, demodulates the NRZ1-inverted PBSG to signal before invertion and outputs the demodulating signal to the said DFF3 303. The above DFF3 303 latches the said demodulating signal by PCK and outputs reproduced data synchronously with the step-down edge of PLLCK.

Figure 19:
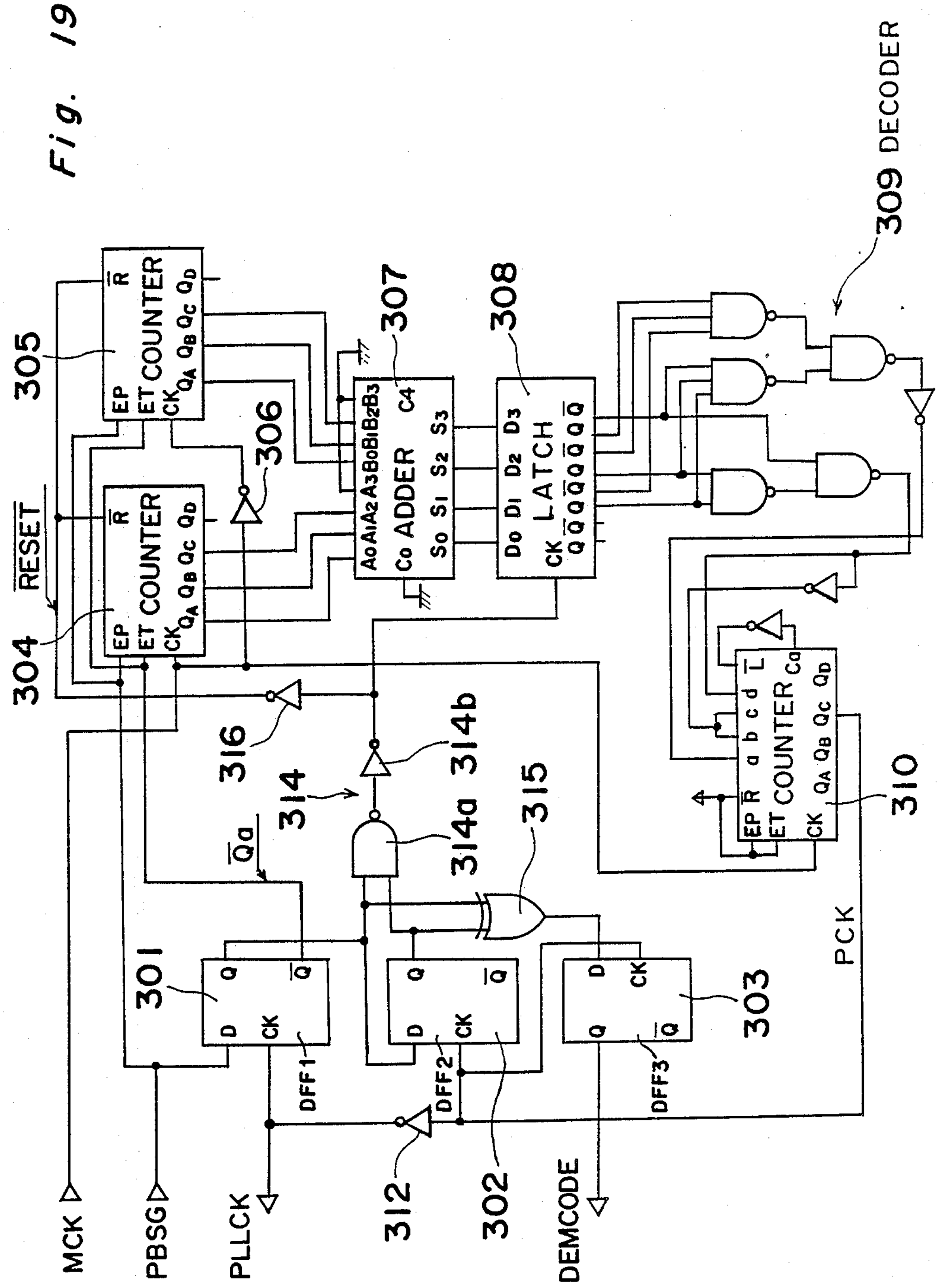
FIG. 19 is a circuit diagram of the above embodiment.
Figure 20:
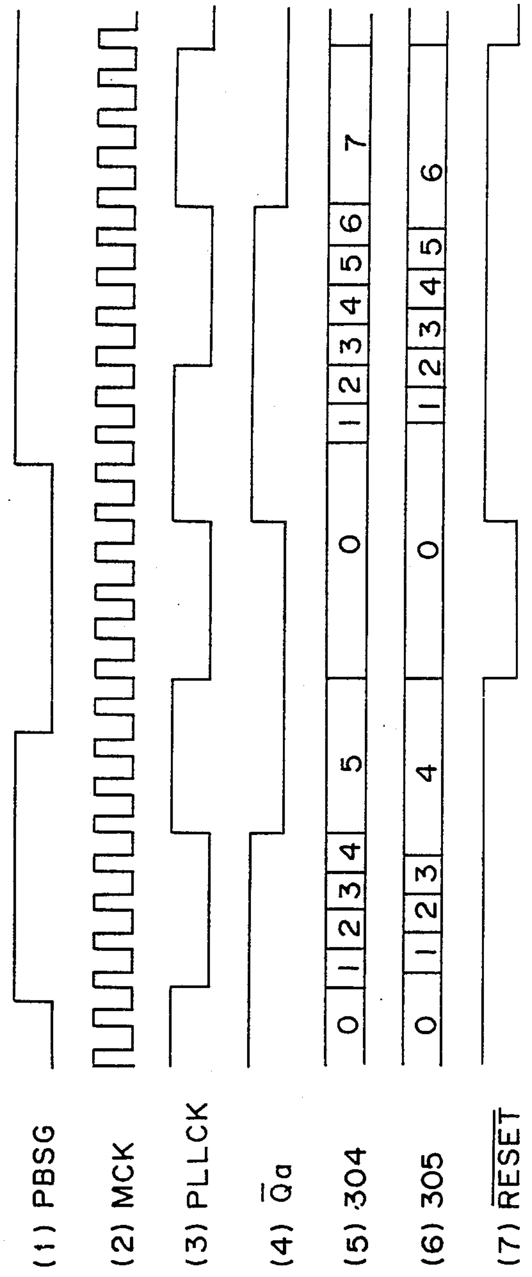
FIG. 20 is a timing chart to explain the circuit operation of the said embodiment.
Figure 21:
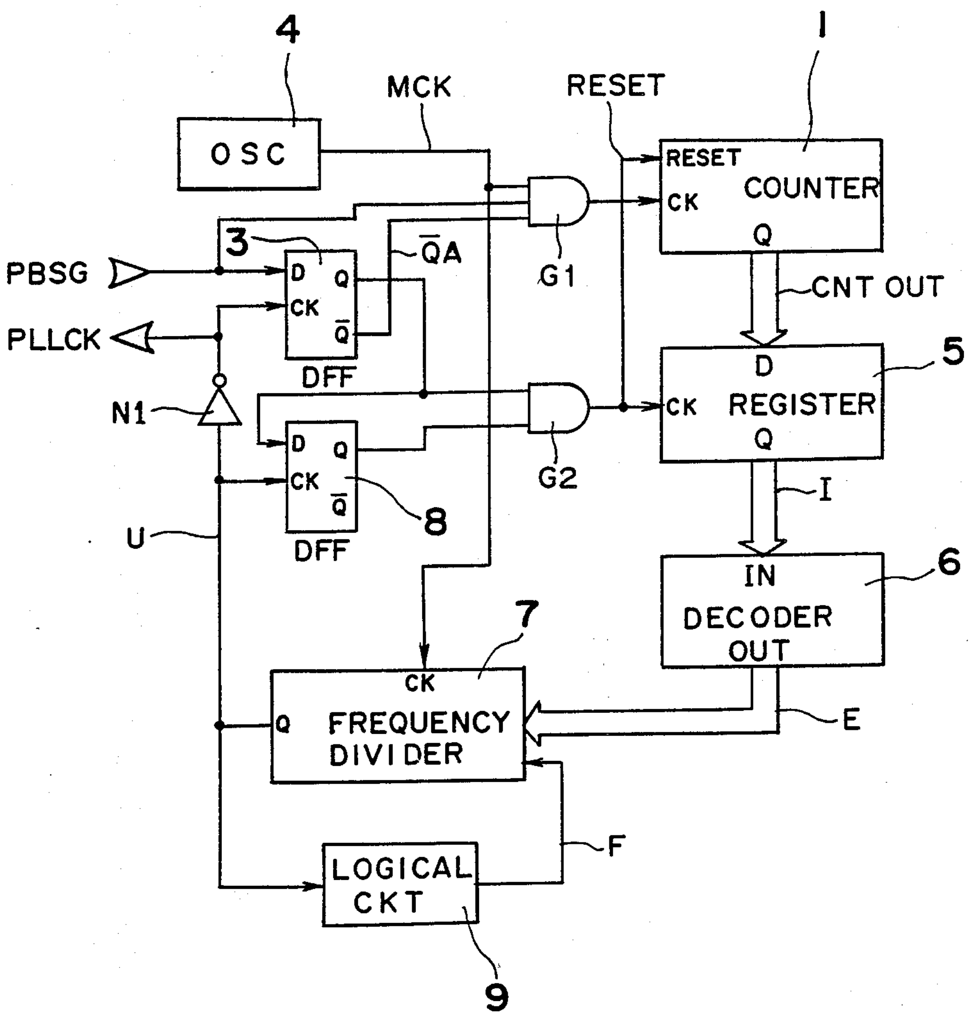
FIG. 21 is a block diagram of a prior art digital phase-locked loop system.
Figure 22:
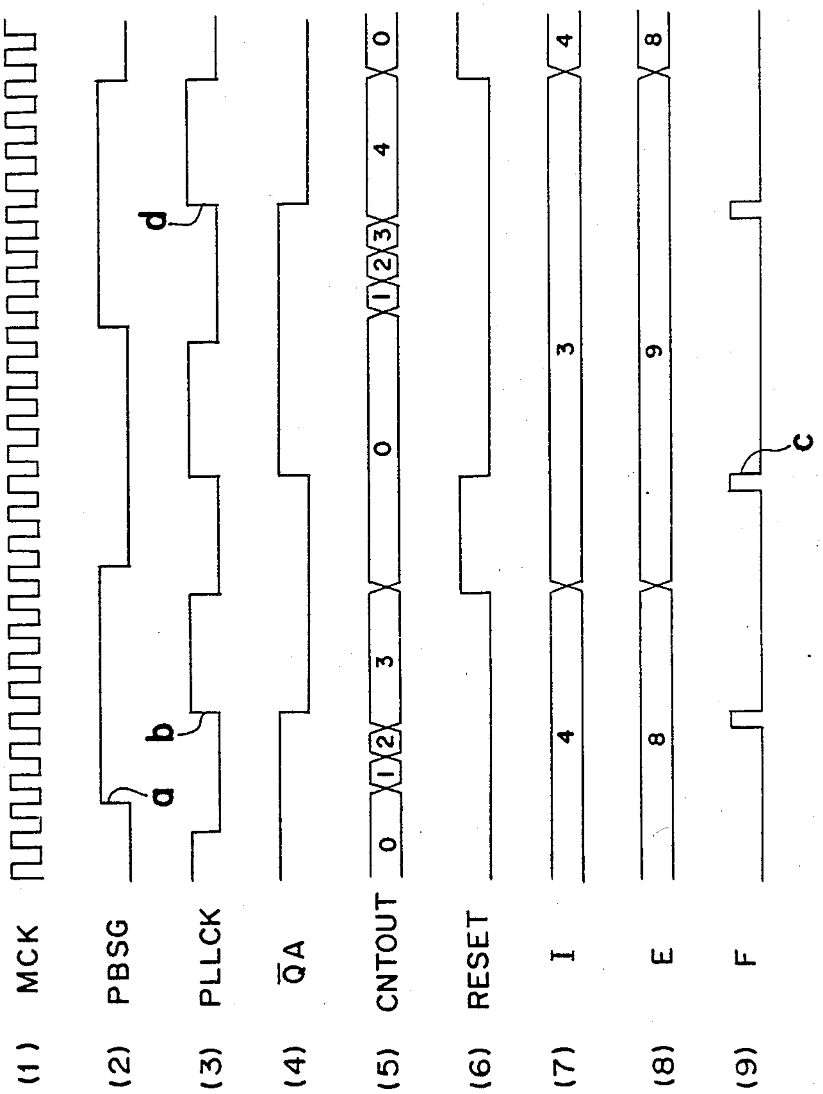
FIGS. 22 and 23 are waveform diagrams to explain operation of the digital phase-locked loop system shown in FIG. 21.
Figure 23:
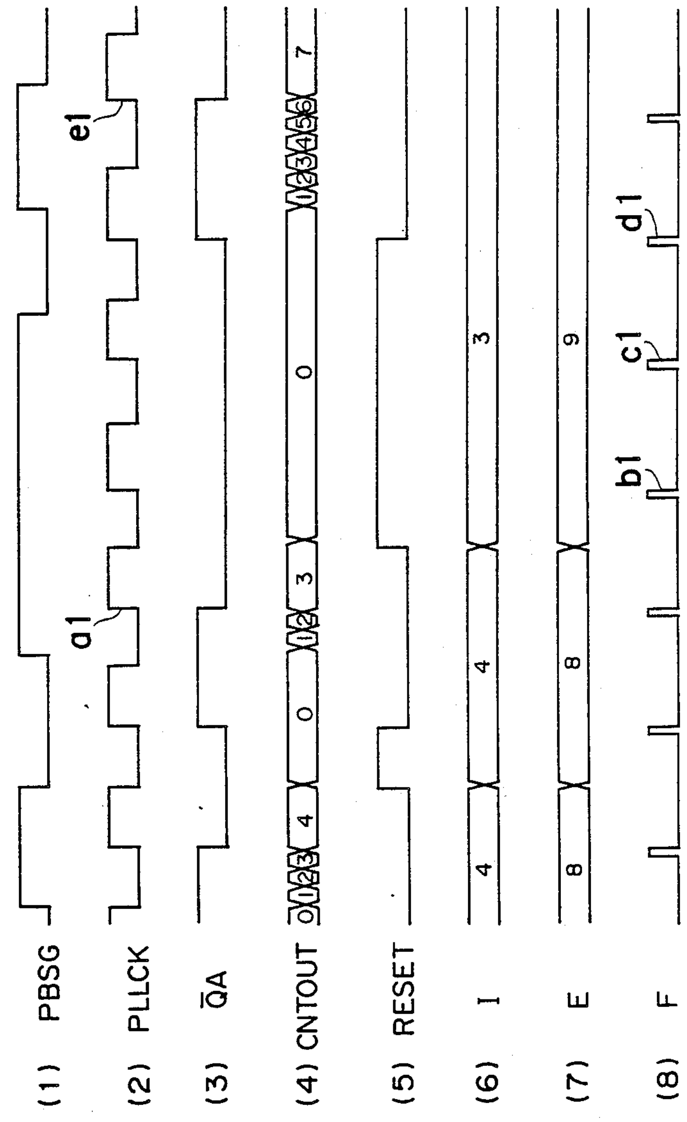

FIG. 19 is an actual circuit diagram of this embodiment and FIG. 20 is a timing chart to explain the operation of this circuit. Operation of the circuit is described below referring to the timing chart.

The said DFF1 301 latches PBSG by PLLCK and outputs $\overline{Q}$ output ($\overline{Q}$a) to the counters 304 and 305. The counters 304 and 305 are counted up when both PBSG and $\overline{Q}$a are 1. Then the counter 304 detects the time from the step-up edge of PBSG to the step-up edge of PLLCK (phase difference) at the step-up edge of MCK. Condition of count at this time is shown as 304 in FIG. 20. On the other hand, the counter 305 detects the said phase difference at the step-down edge of MCK. The count condition of the counter 305 at this time is shown as 305 in FIG. 20. The counted values of the said counter 304 and counter 305 are added by the adder 307 and the result is output to the latch 308. The latch 308 latches the addition result immediately before the counters 304 and 305 are reset by the reset signal $\overline{RESET}$ shown in FIG. 20 and outputs the result to the decoder 309. The decoder 309 outputs "7" when the said addition result is 0–5, "8" when it is 6–9, or "9" when it is A–F as load of the terminals a–d of the counter 310 which are the clock generating counter. As described referring to FIG. 18, the clock generating counter 310 outputs clock PCK prepared by frequency-dividing MCK based on the output from the said decoder 309 to DFF1, DFF2, and DFF3. The AND circuit 314 composed of NAND circuit 314*a* and NOT circuit 314*b* receives the Q output of DFF1 301 and DFF2 302 and outputs the reset signal to the counters 304 and 305, while it outputs the latch clock to the latch 308. On the other hand, the EXOR circuit 315 receives the Q output of DFF1 301 and Q output of DFF2 302, demodulates PBSG and outputs the result to DFF3 303. DFF3 303 latches this demodulating signal by PCK and outputs the reproduced data (DEMCODE) synchronized at the end of PLLCK.

As described above, phase difference between PBSG and PLLCK is detected by the counter 304 at the step-up edge of MCK and by the counter 305 at the step-down edge of MCK and the said two phase differences are added by the adder 307, which enables to reduce the frequency of MCK to ½ of the former examples. Clock PCK having frequency according to the said phase difference is generated by the counter 310 and this clock PCK is inverted by the inverter 312 as PLLCK, which improves the follow-up characteristic to the frequency variation of the input signal.

As is clear from the above description, with the digital PLL system according to this invention, phase difference between input data and reproduction clock is detected by the first counter at the step-up edge of the basic clock, while the said phase difference is detected by the second counter at the step-down edge of the basic clock, the two phase difference are added by the adder, the addition results are hold by latch, the frequency dividing rate is decoded by the decoder according to the addition result held by the said latch, and phase locked loop clock is generated by the frequency divider by frequency-dividing the said clock according to the decoded frequency dividing rate, which enables to lower the frequency of the basic clock and can improve the follow-up characteristic to the frequency variation of input signal.

The invention being thus described, it will be obvious that the same may be varied in many ways. Such variation are not to be regarded as a departure from the spirit and scope of the invention, and all such modifications as would be obvious to one skilled in the art are intended to be included within the scope of the following claims.

What is claimed is:

1. A digital phase-locked loop system comprising:

an oscillator for generating a clock signal of a stationary frequency;

a frequency divider dividing the clock signal generated by the oscillator to produce a phase-locked loop signal;

phase difference detecting means for detecting phase difference between an input signal and the phase-locked loop clock signal and output a phase difference detection signal;

frequency dividing rate setting means for setting frequency dividing rate corresponding to the phase difference in response to the phase difference to the phase difference detecting signal and for supplying the frequency dividing rate to the frequency divider;

frequency division constant setting means for supplying a predetermined frequency dividing rate to the frequency divider; and frequency dividing rate switching means for supplying the frequency divider with an output from the frequency dividing rate setting means in response to the phase difference detection signal when the phase difference is detected and then supplying the frequency divider with an output from the frequency dividing constant setting means.

2. A digital phase-locked loop system comprising:

an oscillator which generates a clock signal of a stationary frequency;

a frequency divider for dividing the clock signal generated by the oscillator to produce a phase-locked loop clock signal;

phase difference detecting means for detecting phase difference between an input signal and the phase-locked loop clock signal and output a phase difference detection signal;

frequency dividing rate setting means for setting a frequency dividing rate corresponding to the phase difference in response to the phase difference detection signal and apply the frequency dividing rate to the frequency divider;

frequency dividing rate adjusting means for detecting frequency components of the input signal in response to the output of the oscillator and set such a frequency dividing rate that the phases of the input signal and phase locked loop clock signal coincide with each other; and a frequency dividing rate switching means for applying the output from the frequency dividing rate setting means to the frequency divider in response to the phase difference detection signal at the time of the detection of the phase difference, and then applying the output from the frequency dividing adjusting means to the frequency divider.

3. A digital phase-locked loop system comprising:

an oscillator which generates a clock signal of a stationary frequency;

a frequency divider for dividing the clock signal generated by the oscillator to produce a phase-locked signal;

phase difference detecting means for detecting phase difference between an input signal and the phase-locked loop clock signal and output phase difference detection signal;

frequency dividing rate setting means including at least two types of decoders with different decode characteristics related to the magnitude of the phase difference detection signal to set a frequency dividing rate corresponding to the phase difference in response to the phase difference detection signal and supply the frequency divider with the frequency dividing rate; and means for selecting either one of the two types of decoders according to a speed mode of the input signal;

so that, in response to the phase difference detection signal, the frequency divider frequency-divides the clock signal at a specified frequency dividing rate set in accordance with the output of the selected decoder and generates the phase-locked loop clock signal.

4. A digital phase-locked loop system comprising:

an oscillator which generates a clock signal of a stationary frequency;

a frequency divider to frequency-divide the clock signal generated by the oscillator and produce a phaselocked loop clock signal;

phase difference detecting means to detect phase difference between an input signal and the phase-locked loop clock signal and output a phase difference detection signal; and frequency dividing rate setting means to set a frequency dividing rate corresponding to the phase difference in response to the phase difference detection signal and apply the frequency dividing rate to the frequency divider;

wherein the phase difference detecting means includes a first counter to detect the phase difference at a leading edge of the clock signal from the oscillator and a second counter to detect the phase difference at a trailing edge of the clock signal, the frequency dividing rate setting means includes an adder to add the phase difference detected by the first counter and the phase difference detected by the second counter, a latch to hold an addition result produced by the adder, and a decoder to decode the frequency dividing rate corresponding to the addition result held by the latch, and the frequency divider frequency-divides the clock signal according to the frequency dividing rate decoded by the decoder and newly generates a phase-locked loop clock signal.

* * * * *